United States Patent
Zhang et al.

(10) Patent No.: US 11,532,592 B2
(45) Date of Patent: Dec. 20, 2022

(54) CAPACITOR DIE FOR STACKED INTEGRATED CIRCUITS

(71) Applicant: WESTERN DIGITAL TECHNOLOGIES, INC., San Jose, CA (US)

(72) Inventors: David C. Zhang, Milpitas, CA (US); Pranav Balachander, Santa Clara, CA (US)

(73) Assignee: Western Digital Technologies, Inc., San Jose, CA (US)

(*) Notice: Subject to any disclaimer, the term of this patent is extended or adjusted under 35 U.S.C. 154(b) by 260 days.

(21) Appl. No.: 16/870,176

(22) Filed: May 8, 2020

(65) Prior Publication Data
US 2021/0351152 A1 Nov. 11, 2021

(51) Int. Cl.
| H01L 23/00 | (2006.01) |
| H01L 23/538 | (2006.01) |
| H01L 23/66 | (2006.01) |
| H05K 1/02 | (2006.01) |
| H01L 23/522 | (2006.01) |

(52) U.S. Cl.
CPC .......... *H01L 24/49* (2013.01); *H01L 23/5226* (2013.01); *H01L 23/5383* (2013.01); *H01L 23/66* (2013.01); *H05K 1/0243* (2013.01); *H01L 2224/49174* (2013.01)

(58) Field of Classification Search
CPC . H01L 24/49; H01L 23/5226; H01L 23/5383; H01L 23/66; H01L 224/49174
See application file for complete search history.

(56) References Cited

U.S. PATENT DOCUMENTS

| 5,864,177 | A | * | 1/1999 | Sundstrom | H01L 24/48 257/E23.079 |
| 6,943,294 | B2 | | 9/2005 | Kang et al. | |
| 7,843,089 | B2 | * | 11/2010 | Ito | G11C 5/025 307/147 |
| 7,880,269 | B2 | | 2/2011 | Heinrichsdorff et al. | |
| 7,943,473 | B2 | | 5/2011 | Ellul et al. | |
| 8,093,717 | B2 | | 1/2012 | Buot et al. | |
| 10,014,276 | B2 | | 7/2018 | Chieh | |
| 10,418,350 | B2 | | 9/2019 | Das et al. | |
| 10,483,209 | B2 | | 11/2019 | Wyland | |
| 2007/0132070 | A1 | * | 6/2007 | V. Buot | H01L 25/16 257/664 |
| 2019/0221678 | A1 | | 7/2019 | Villa et al. | |
| 2019/0371414 | A1 | | 12/2019 | Nguyen et al. | |
| 2020/0402903 | A1 | * | 12/2020 | Chen | H01L 23/5223 |

OTHER PUBLICATIONS

Lei He et al., "System-in-Package: Electrical and Layout Perspectives", now the essence of knowledge, Foundations and Trends in Electronic Design Automation, vol. 4, No. 4, Jun. 30, 2011, pp. 223-306.

* cited by examiner

*Primary Examiner* — Marc Anthony Armand
(74) *Attorney, Agent, or Firm* — Vierra Magen Marcus LLP

(57) ABSTRACT

An apparatus is provided that includes a die stack having a first die and a second die disposed above a substrate, and a capacitor die disposed in the die stack between the first die and the second die. The capacitor die includes a plurality of integrated circuit capacitors that are configured to be selectively coupled together to form a desired capacitor value coupled to at least one of the first die and the second die.

18 Claims, 24 Drawing Sheets

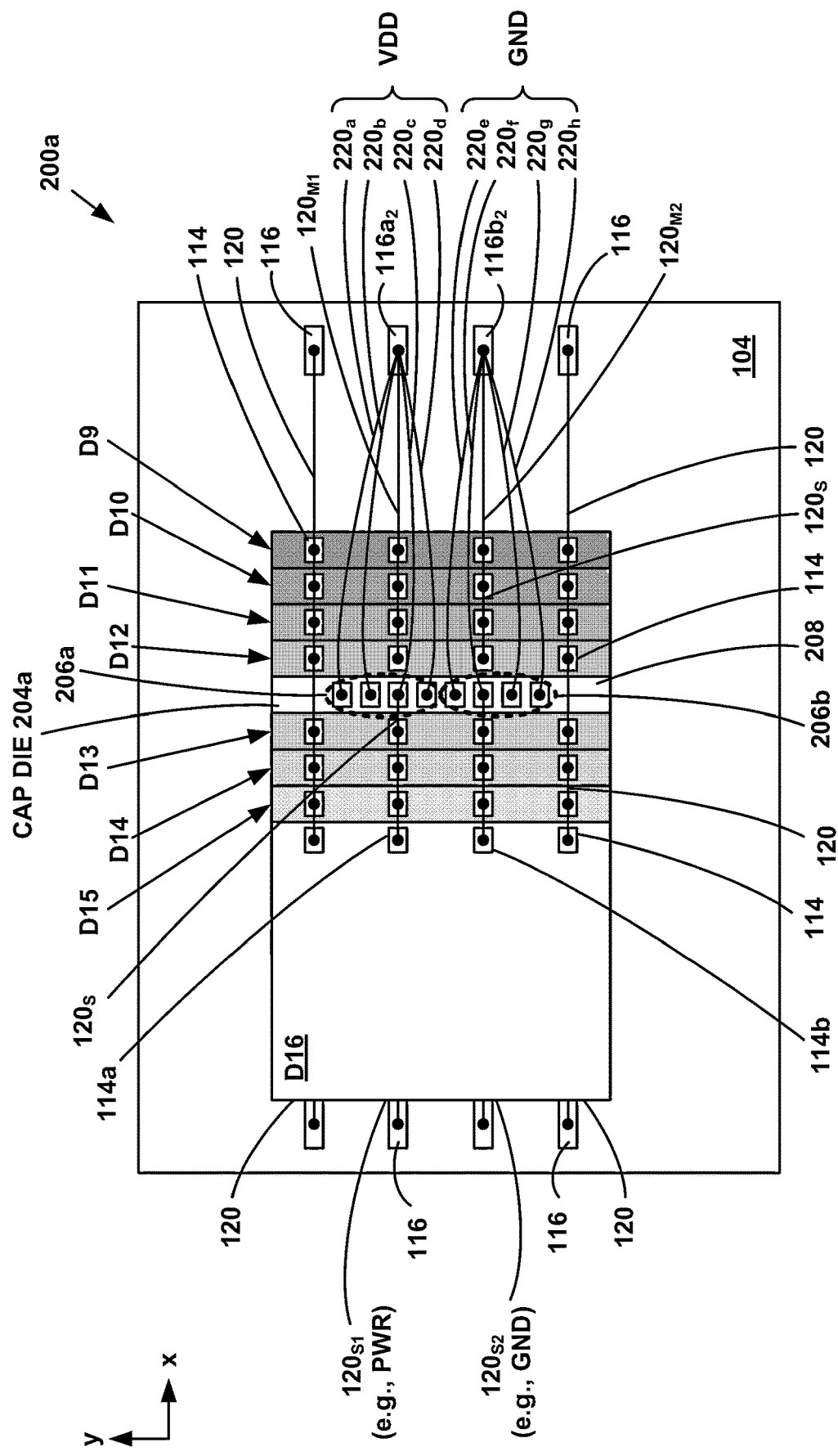
FIG. 2B1

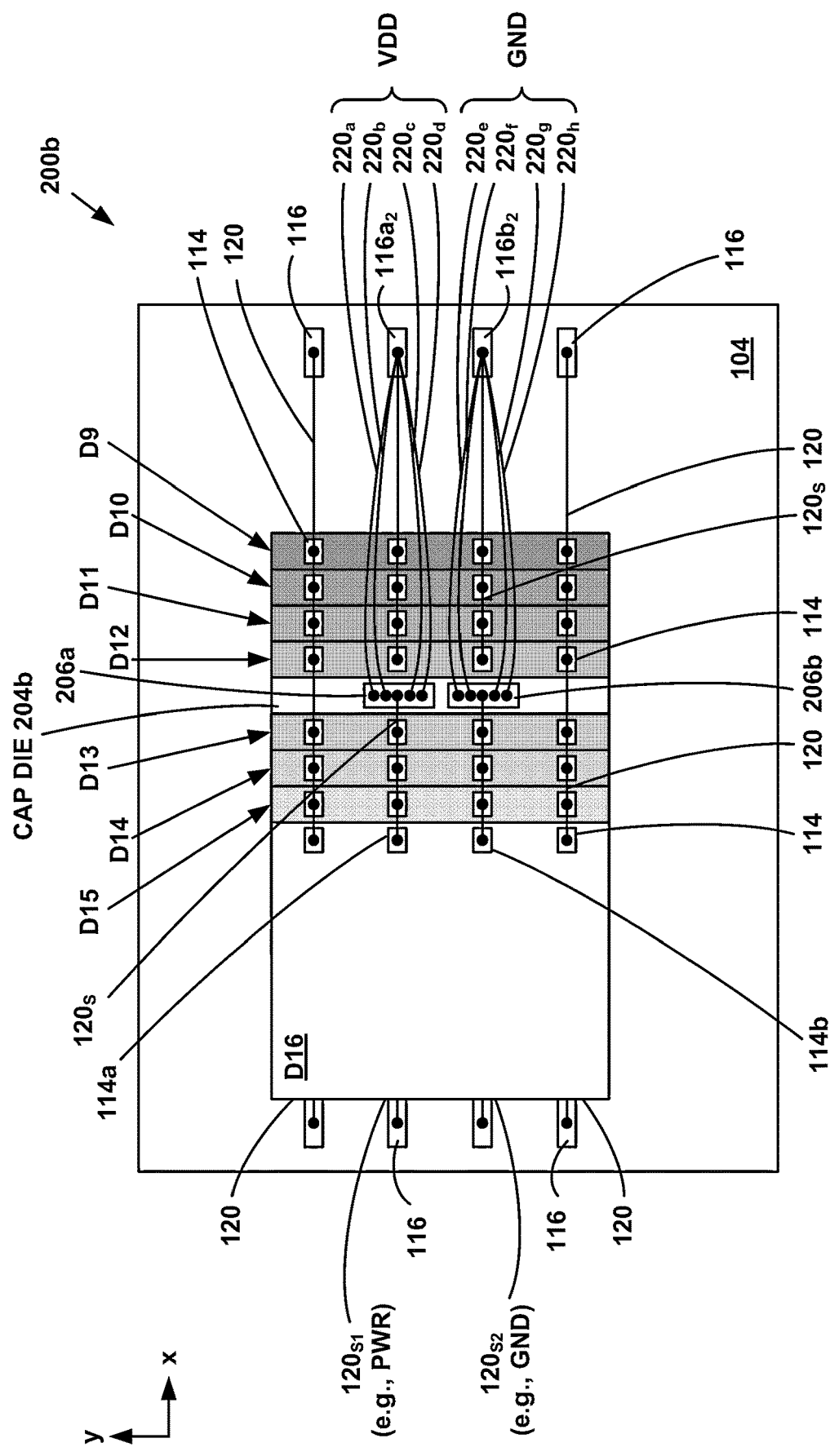
FIG. 2B2

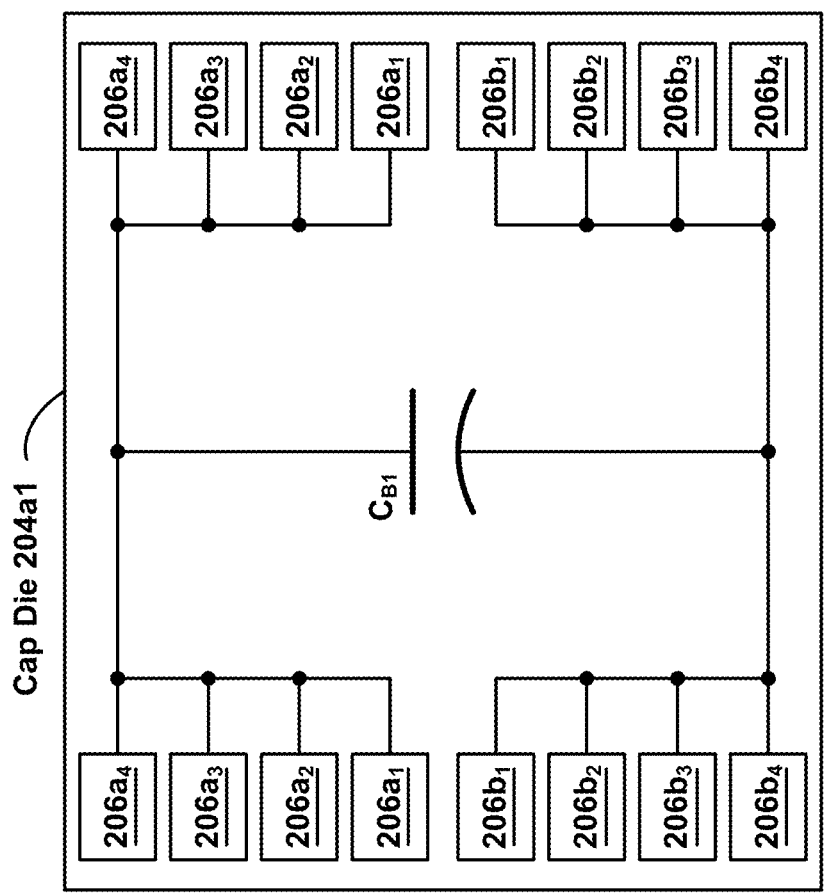
FIG. 2C1

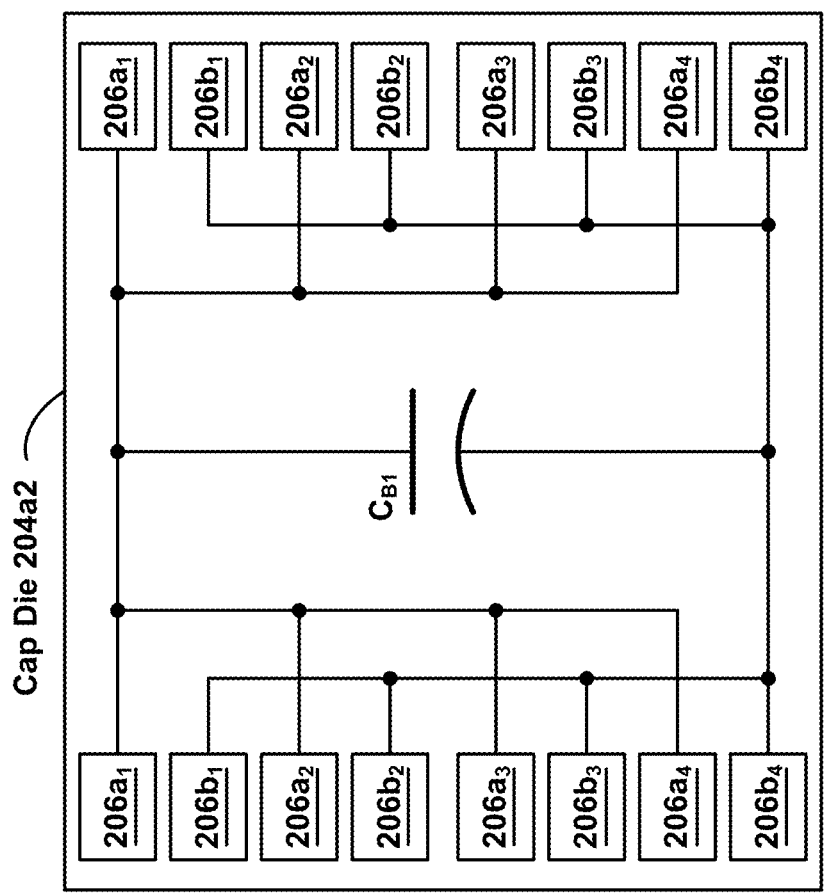
FIG. 2C2

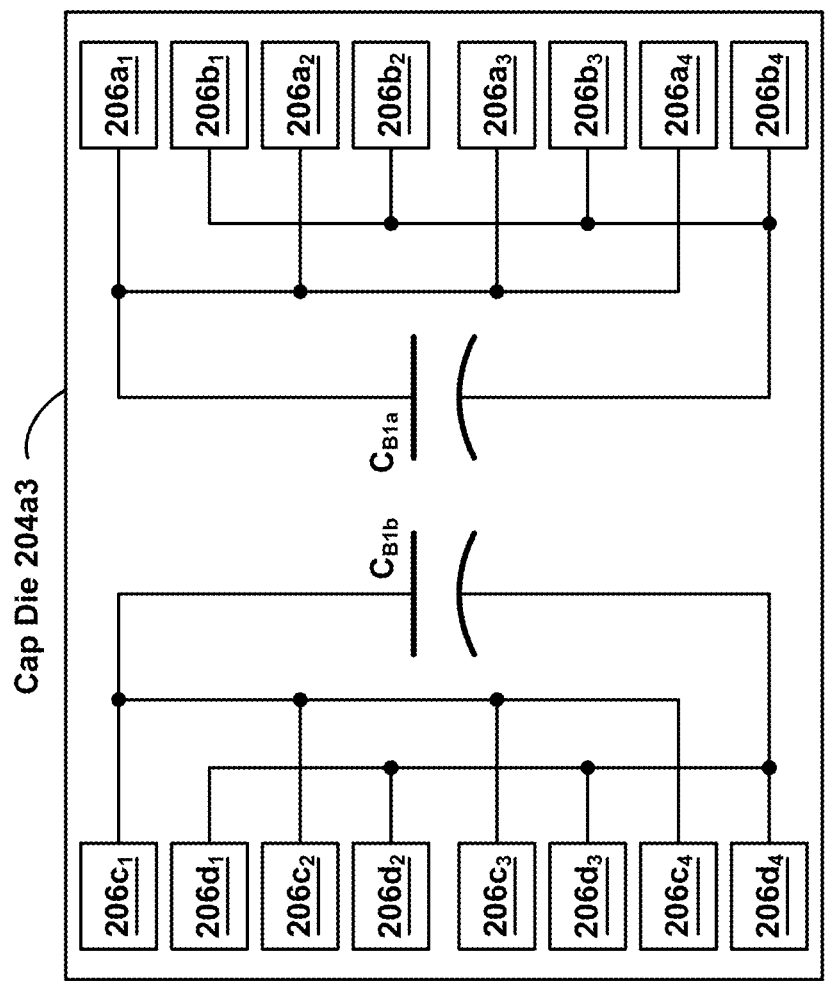
FIG. 2C3

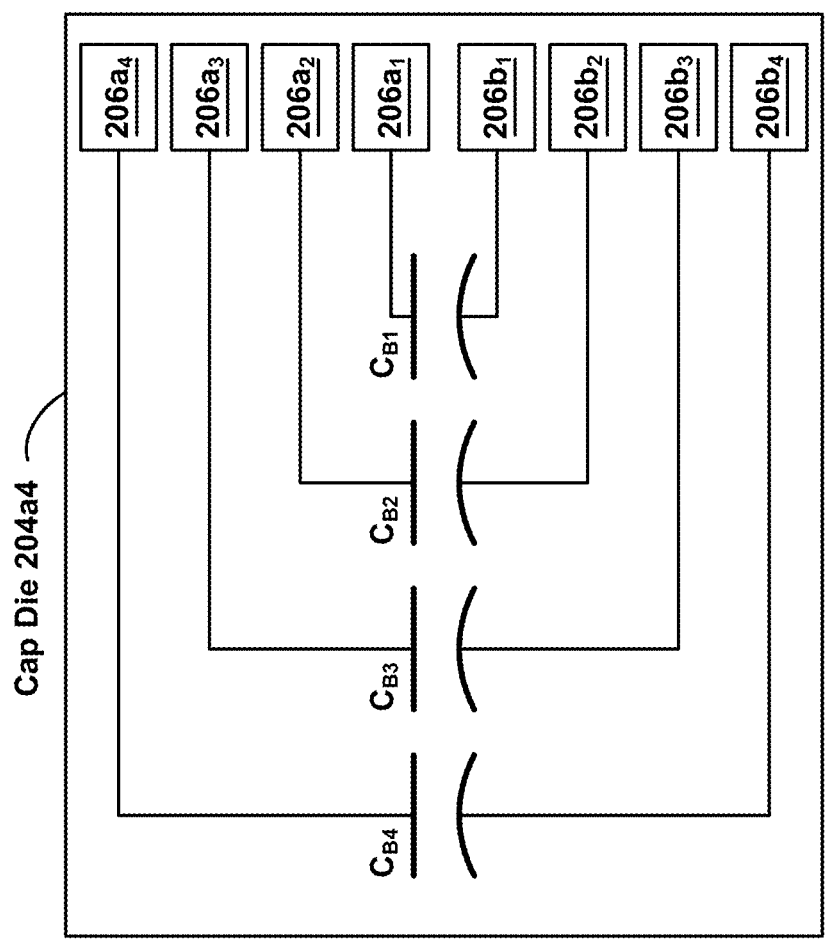

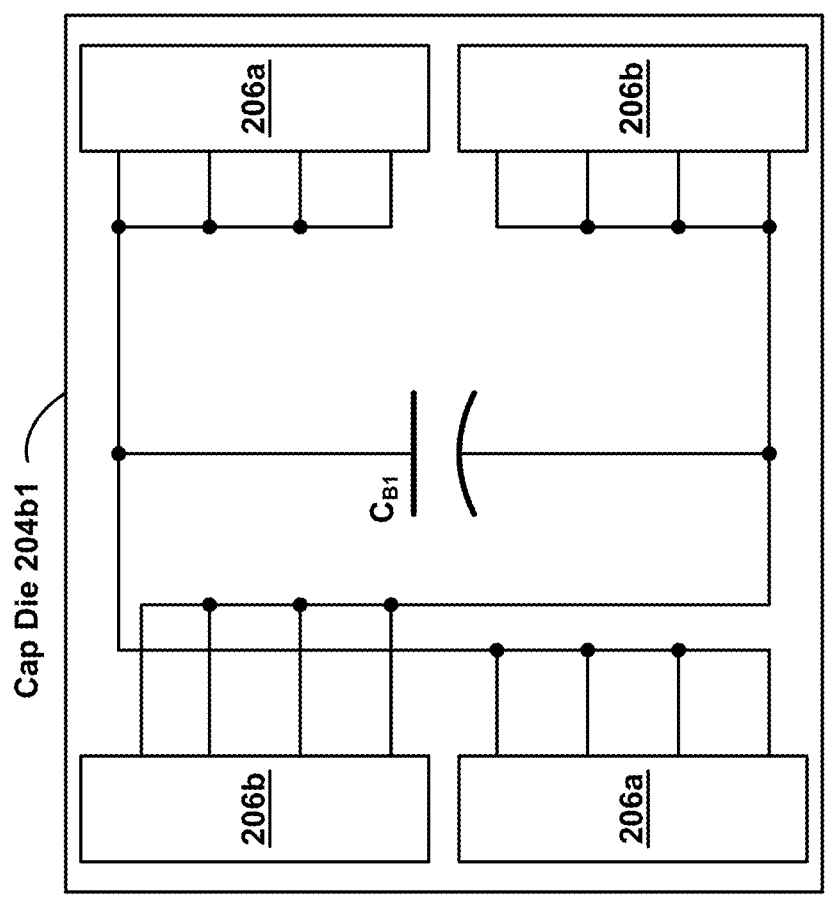
FIG. 2C5

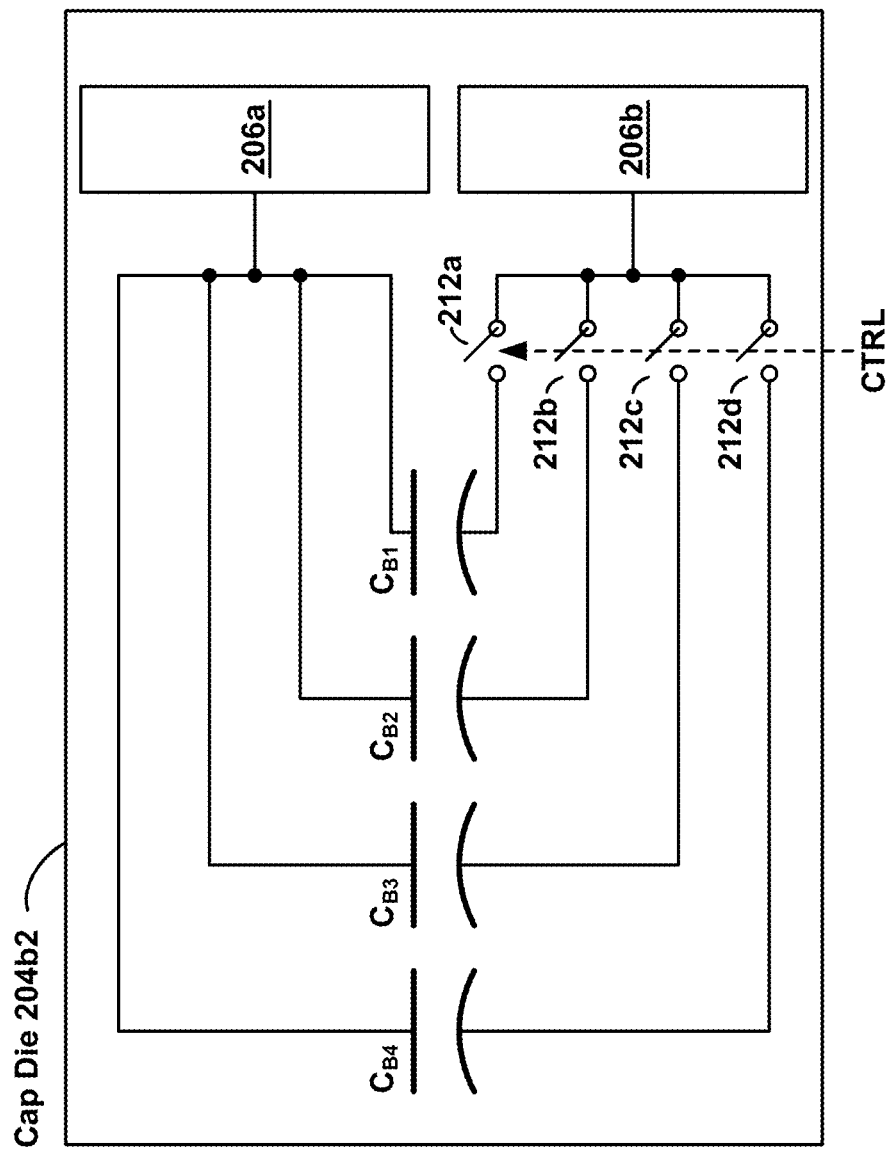
FIG. 2C6

FIG. 3A1

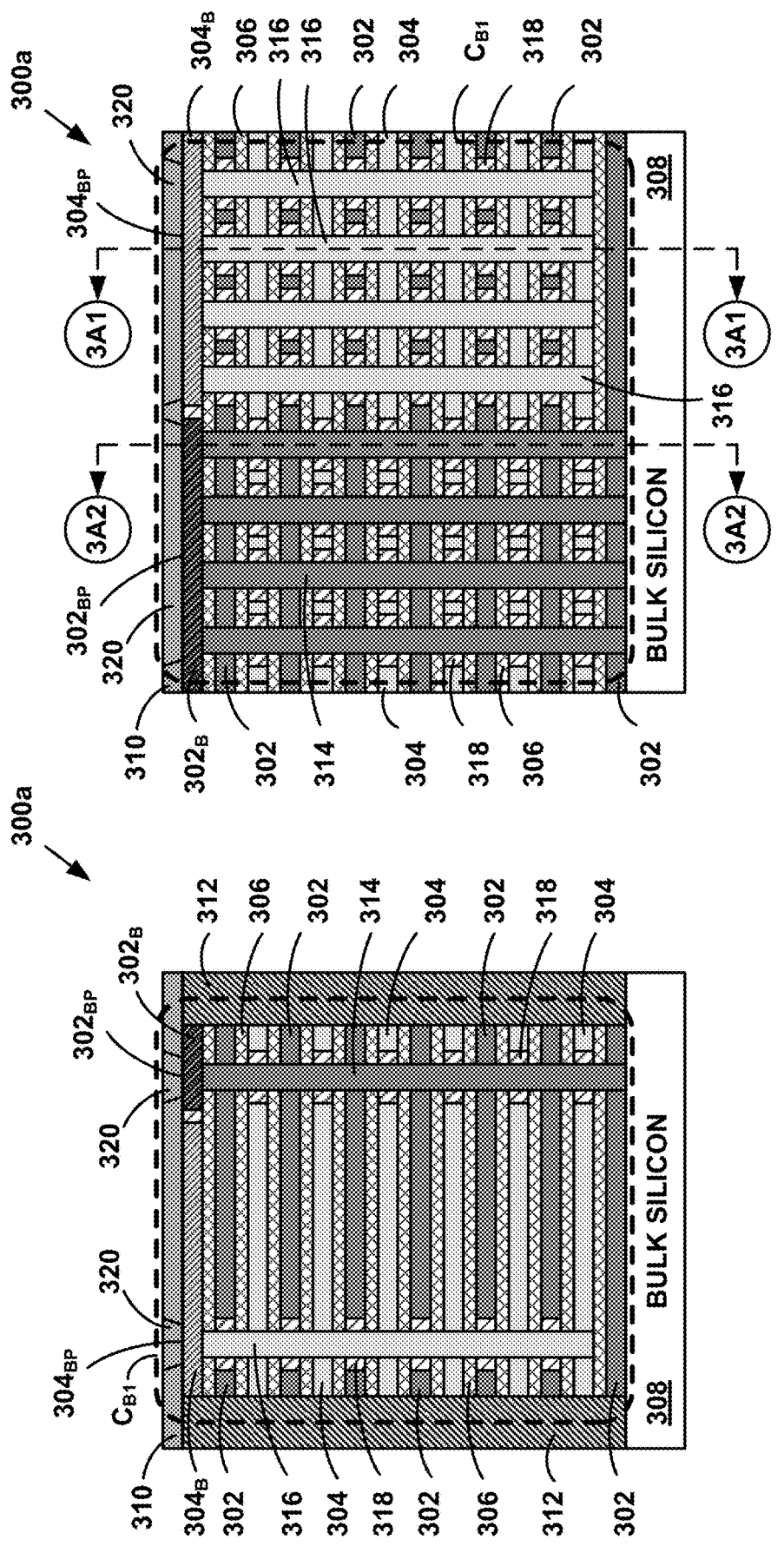

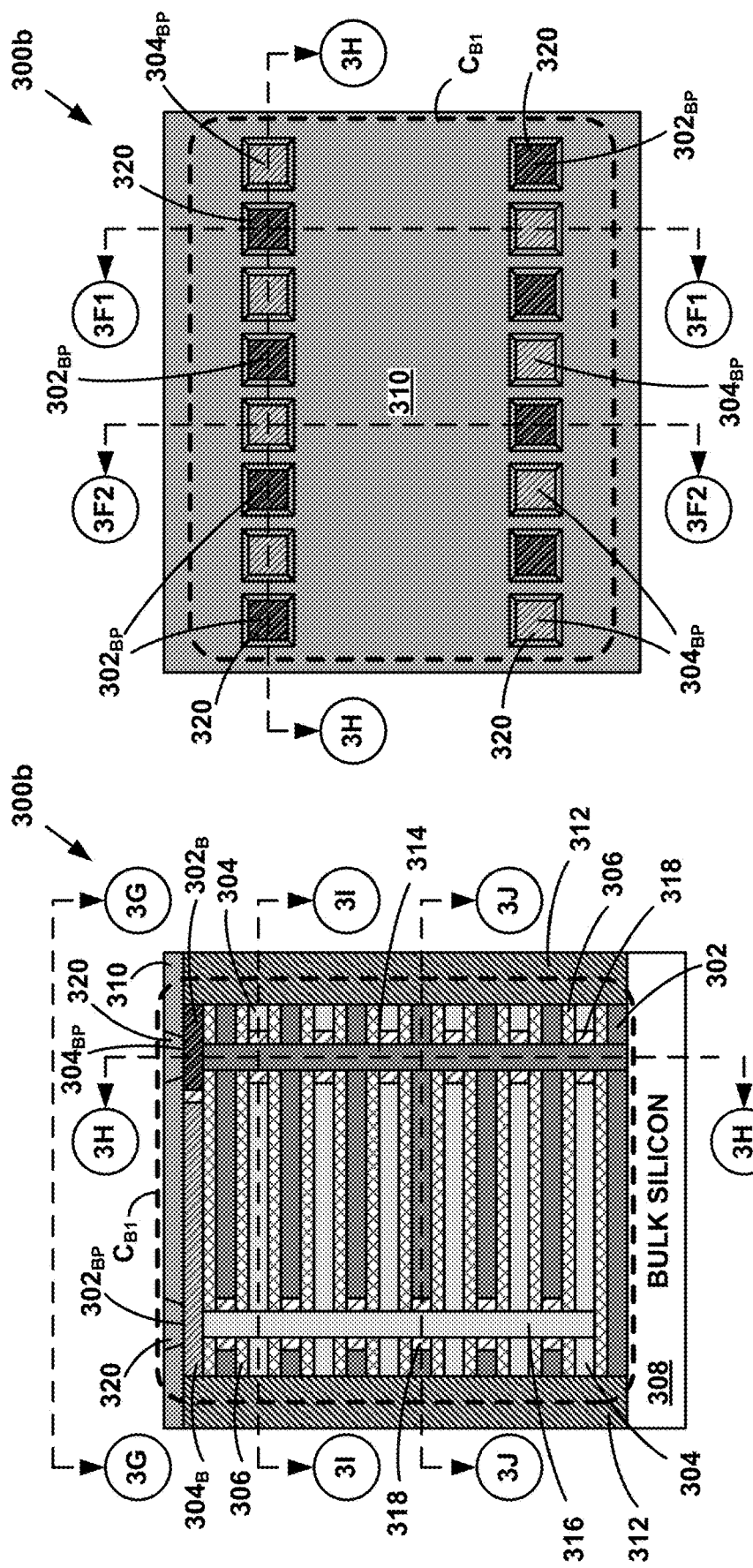

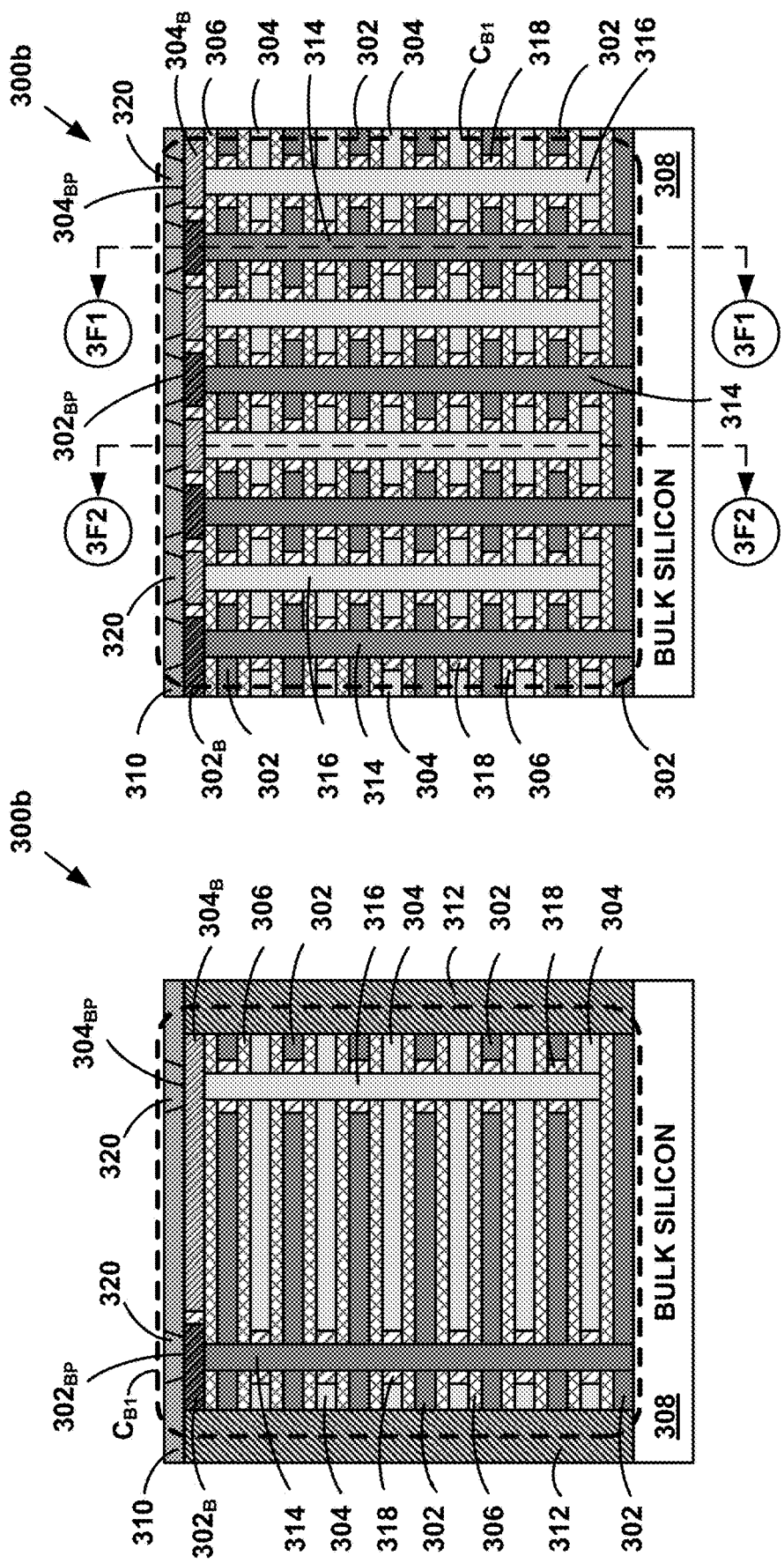

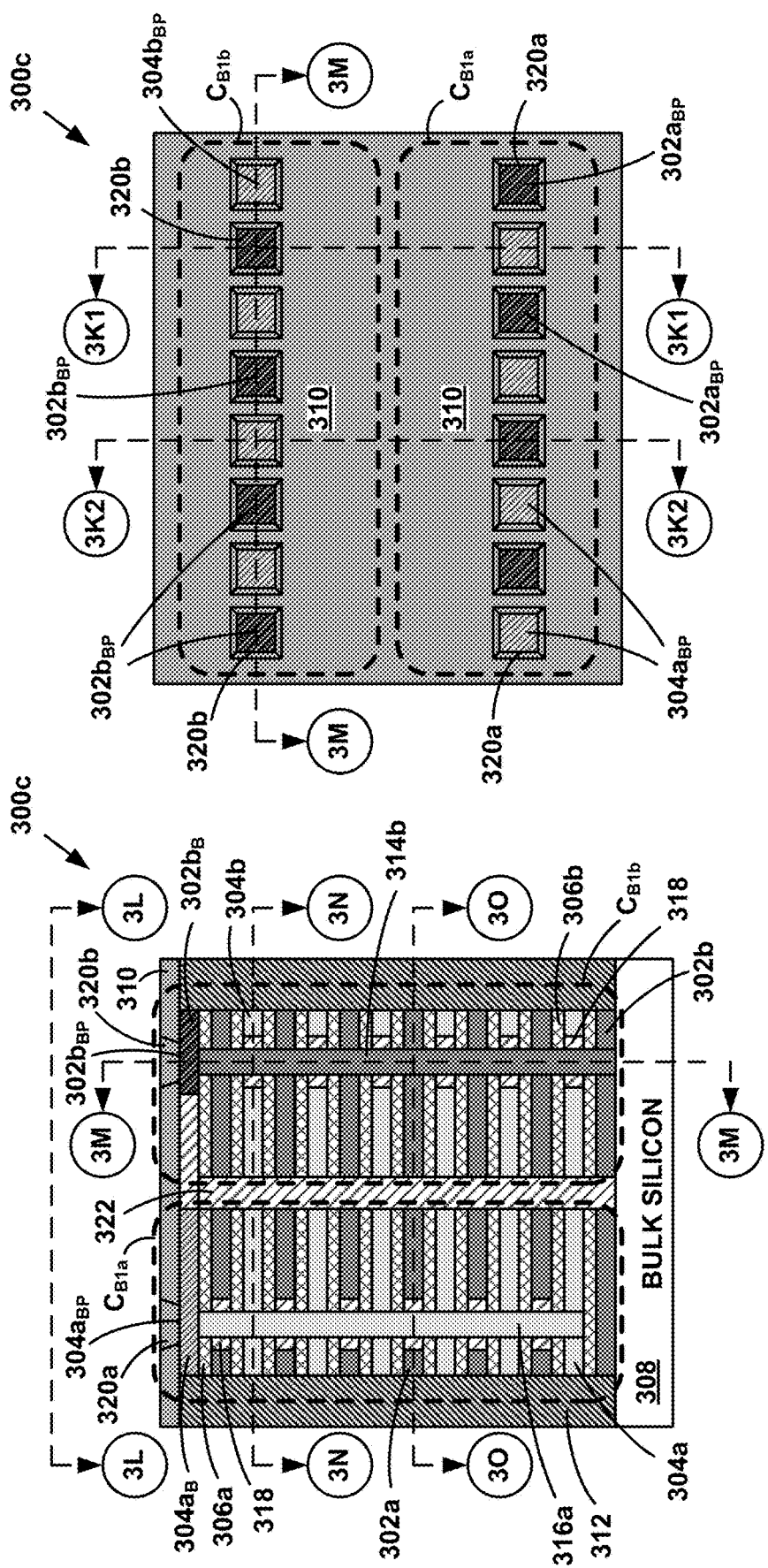

FIG. 3K2

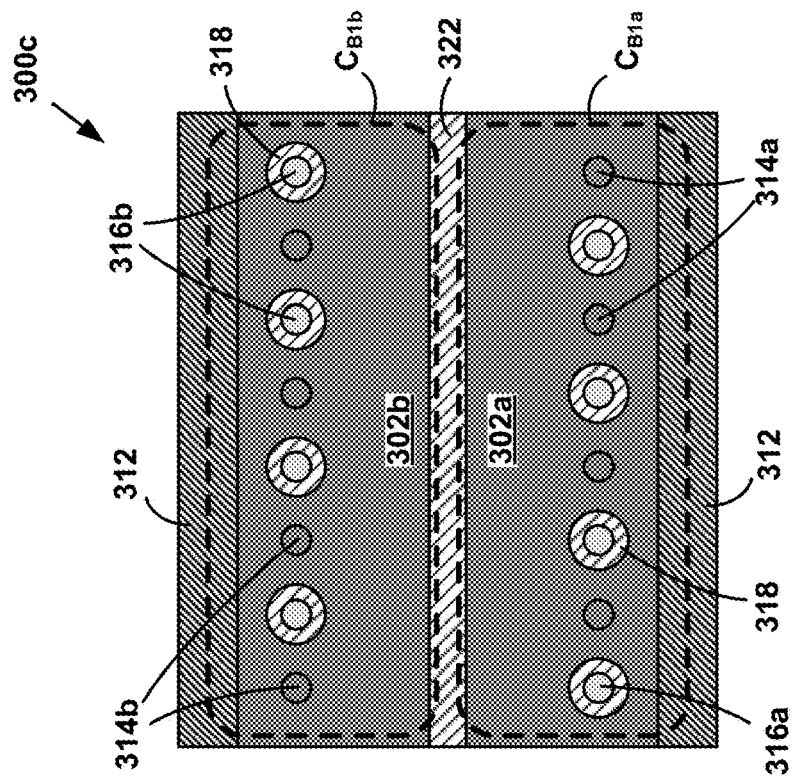
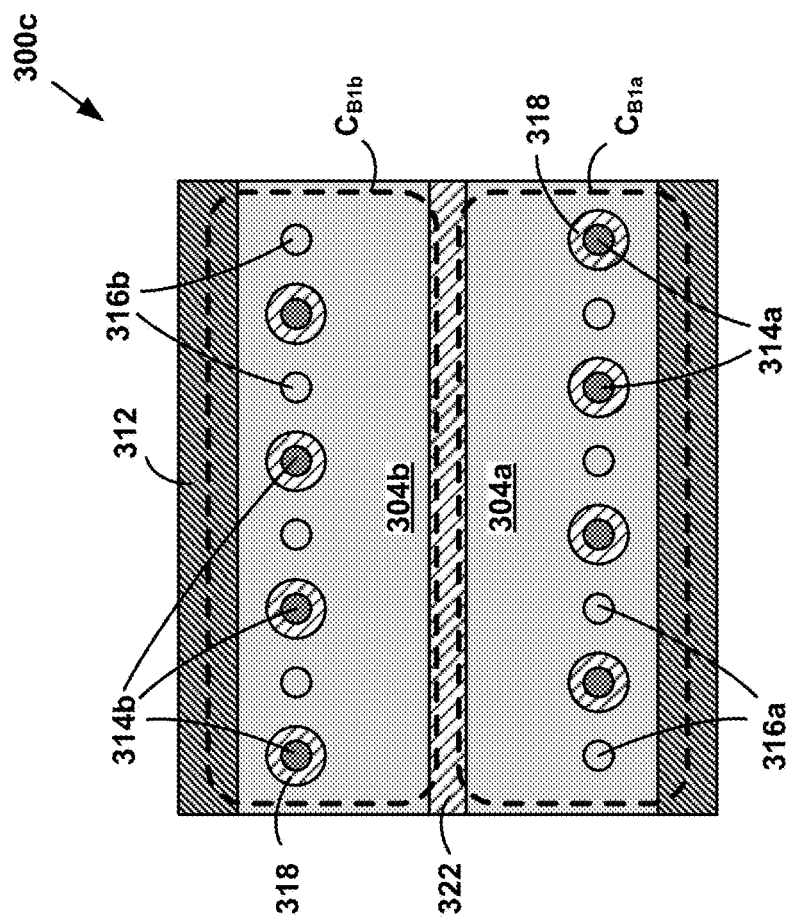
FIG. 3O
FIG. 3N

FIG. 3P1

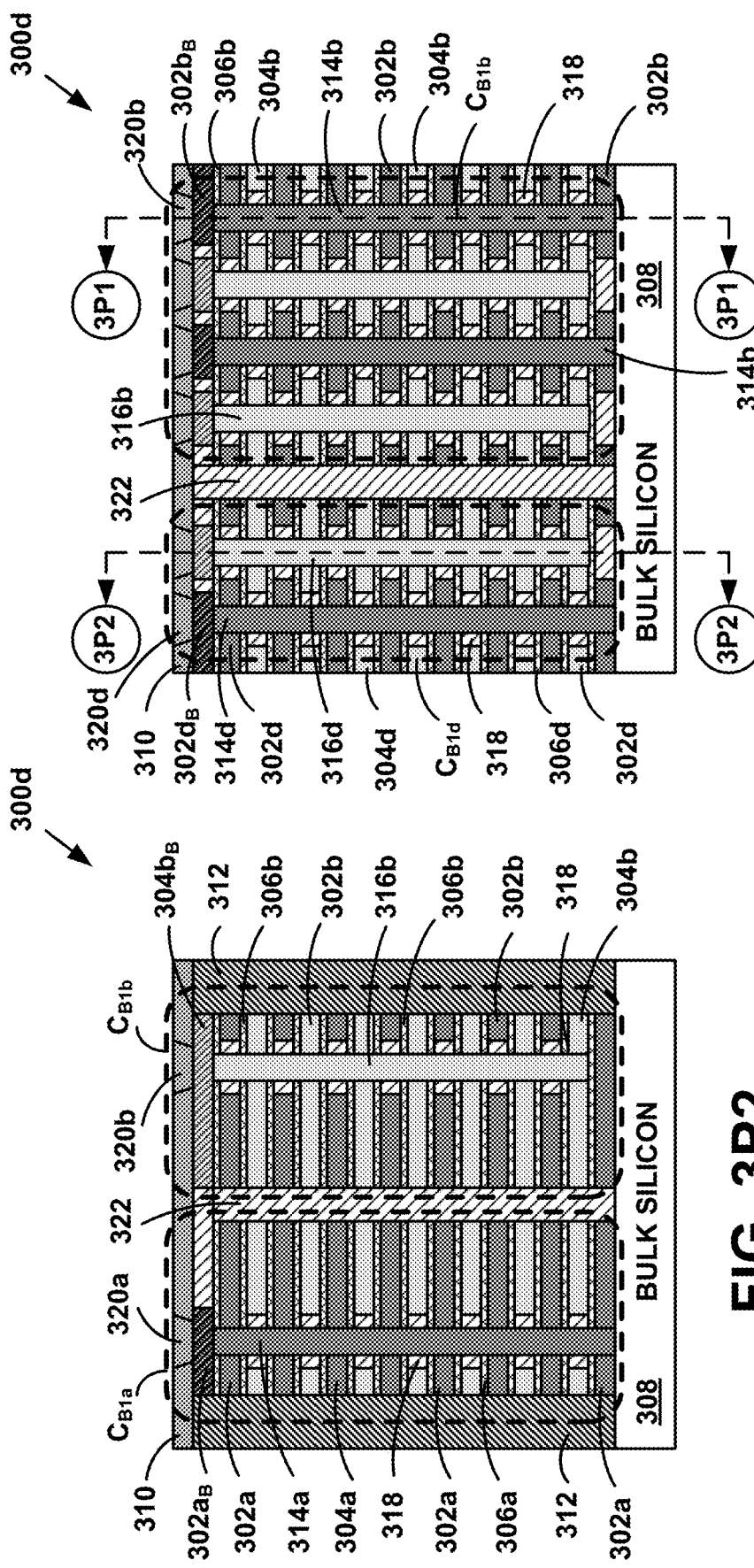

CAPACITOR DIE FOR STACKED INTEGRATED CIRCUITS

BACKGROUND

The strong demand for portable consumer electronics devices is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, mobile telephones and solid state drives.

Semiconductor devices, such as semiconductor memory devices, are sometimes formed in a System in a Package (SiP) device that includes multiple semiconductor die mounted in a stack on a substrate. The die in the stack are often electrically coupled to the substrate using wire bonds. In some semiconductor devices (e.g., memory devices), the stack may include a relatively large number of die (e.g., 8, 16, 32 or 64 die). As the number of die in the stack increases, the length of wire bonds coupling die near the top of the stack to the substrate also increases. With increasing length, the effects of parasitic inductance and resistance in the wire bonds becomes problematic, particularly for high frequency operation.

As a result, power supply noise and ground bounce increase, which negatively impacts signal integrity and power integrity for high-stacked integrated circuits such as semiconductor memory devices. As semiconductor devices are continually being designed to operate at higher frequencies, the parasitic inductance of the wire bonds may limit the number of die that can be stacked and mounted on a substrate. For semiconductor memory devices, such a limitation may limit the capacity of such memory devices.

BRIEF DESCRIPTION OF THE DRAWINGS

Like-numbered elements refer to common components in the different figures.

FIGS. 2B1-2B2 are top views of various embodiments of the capacitor die of FIG. 2A.

FIGS. 2C1-2C4 depict simplified schematic diagrams of embodiments of the capacitor die of FIG. 2B1.

FIGS. 2C5-2C6 depict simplified schematic diagrams of embodiments of the capacitor die of FIG. 2B2.

FIGS. 3A1-3T depict various views of embodiments of capacitor die of the described technology.

DETAILED DESCRIPTION

Figure 1A:
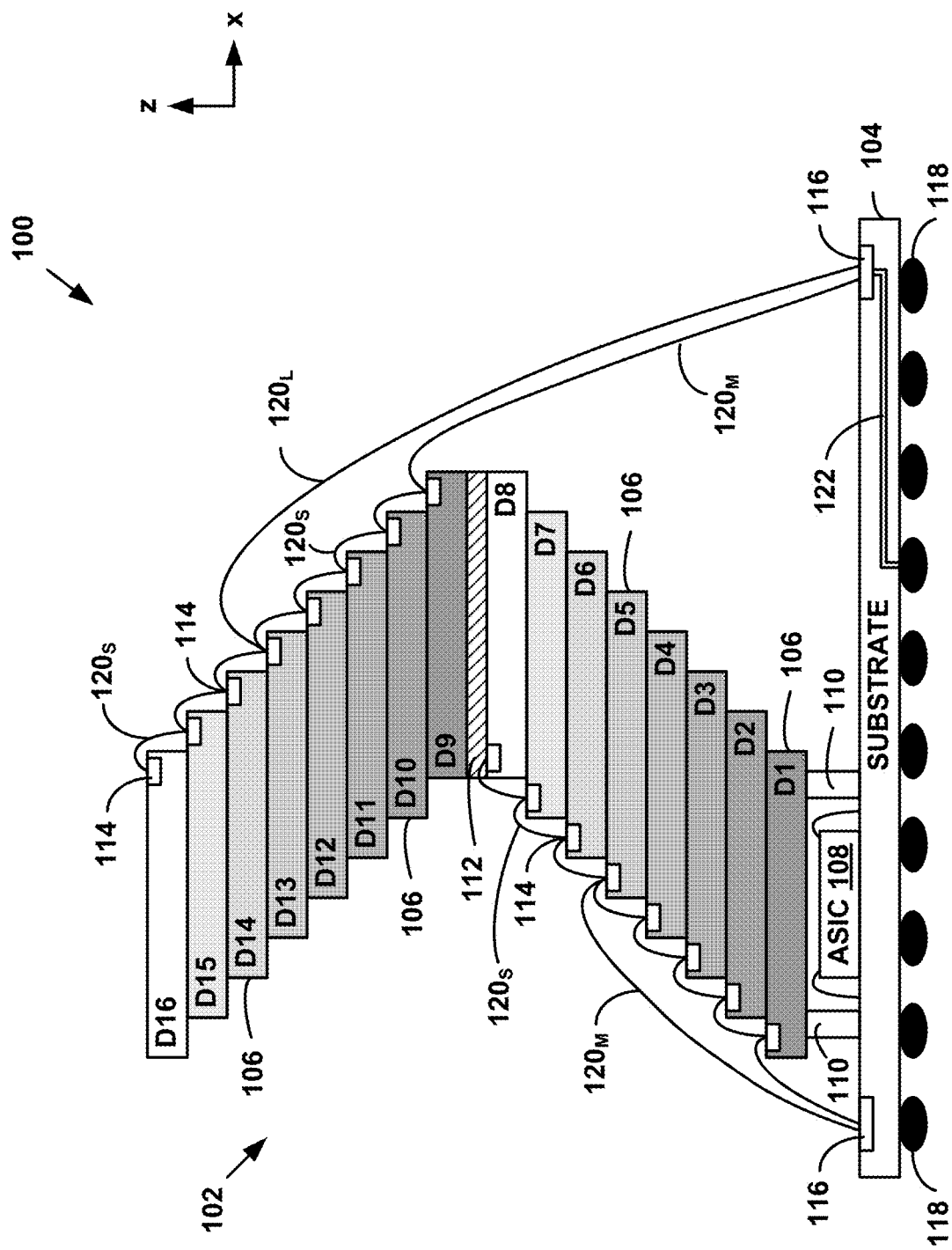
FIGS. 1A and 1B depict side and top views, respectively, of a previously known semiconductor device that includes a semiconductor die stack.
Figure 1B:
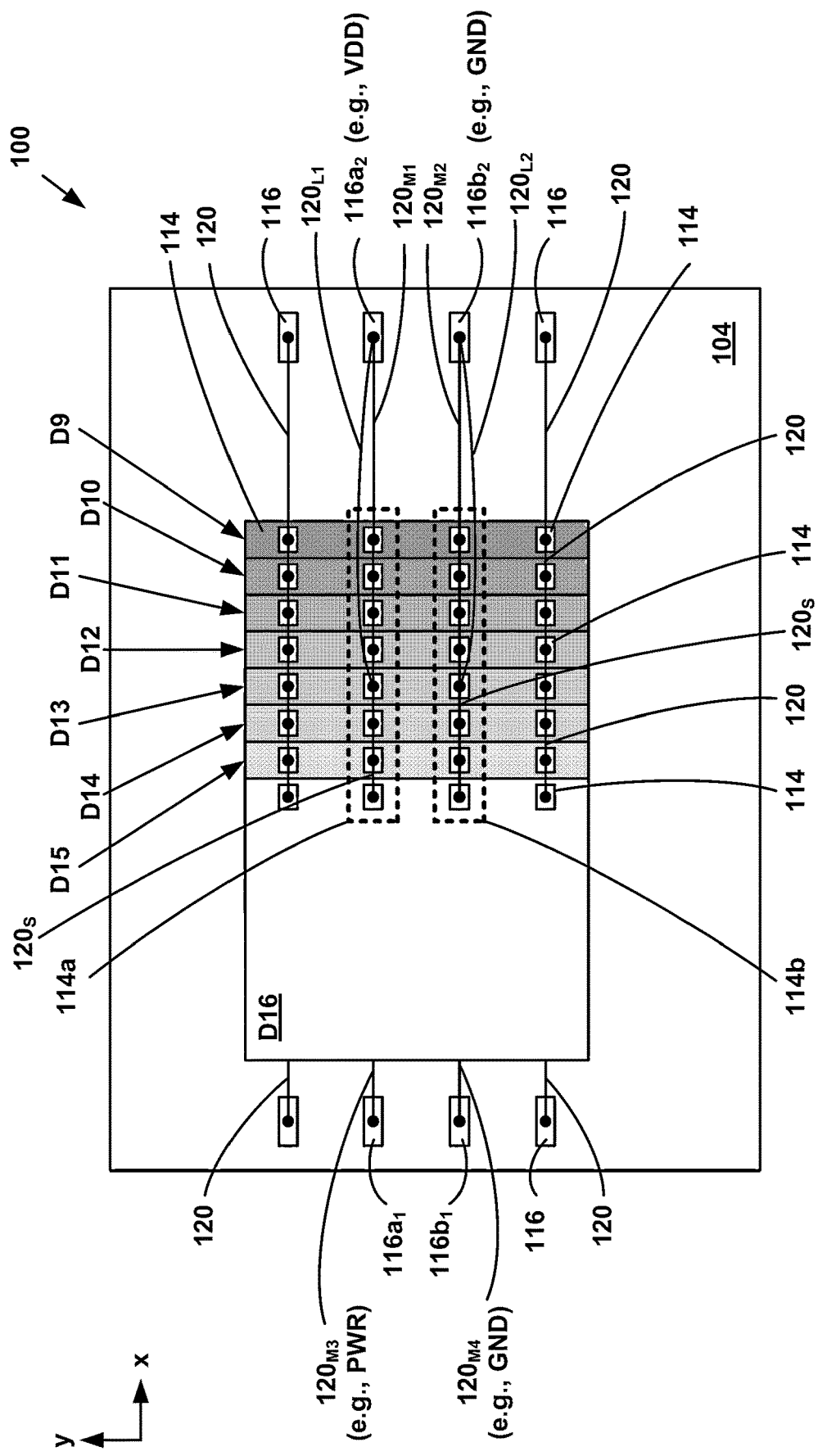

FIGS. 1A and 1B depict side and top views, respectively, of a previously known semiconductor device 100 that includes a semiconductor die stack 102 formed on a substrate 104, such as a printed circuit board (PCB), a leadframe, a tape automated bonded (TAB) tape, or other similar substrate. Die stack 102 includes sixteen die 106 (e.g., semiconductor memory die), although more or fewer than sixteen die 106 may be used. A logic integrated circuit (e.g., an application specific integrated circuit (ASIC)) 108 is disposed on substrate 104, and die stack 102 is disposed above ASIC 108 on supports 110.

A first group of die 106 (e.g., D1-D8) are offset from one another in a first direction (e.g., +x-axis), and a second group of die 106 (e.g., D9-D16) are offset from one another in a second direction (e.g., −x-axis) opposite the first direction, with a film 112 (e.g., a thick die-attach film) disposed between the first group of die 106 and the second group of die 106.

One or more bond pads 114 are disposed along an edge of a top surface of each die 106, one or more contact pads (or "bond fingers") 116 are disposed on a top surface of substrate 104, and one or more solder balls 118 are disposed along a bottom surface of substrate 104. To avoid overcrowding the drawings, each die 106 is shown including four bond pads 114, and substrate 104 is shown including eight contact pads 116.

Persons of ordinary skill in the art will understand that an integrated circuit die typically includes many more than four bond pads, and a substrate typically includes many more than eight contact pads. Bond pads 114 and contact pads 116 are used to electrically interconnect die 106 to one another and to substrate 104 via wire bonds 120 (e.g., gold, gold alloy, or some other material). Substrate 104 includes one or more conductive traces 122 electrically coupling contact pads 116 to solder balls 118.

To avoid overcrowding the drawings, each die 106 is shown including a first power supply bond pad 114a (e.g., VDD) and a second power supply bond pad 114b (e.g., GND), and substrate 104 is shown including first power supply contact pads $116a_1$ and $116a_2$ (e.g., VDD) and second power supply contact pads $116b_1$ and $116b_2$ (e.g., GND). Persons of ordinary skill in the art will understand that an integrated circuit die typically includes more than two power supply bond pads, and a substrate typically includes more than four power supply contact pads. First power supply contact pad $116a_1$ and second power supply contact pad $116b_1$ provide power to die D1-D8, and first power supply contact pad $116a_2$ and second power supply contact pad $116b_2$ provide power to die D9-D13.

In particular, as illustrated in FIG. 1B, first power supply bond pads 114a on each of die D9-D16 are coupled to one another by wire bonds $120_S$, first power supply bond pad 114a on die D9 is coupled to first power supply contact pad $116a_2$ by wire bond $120_{M1}$, and first power supply bond pad 114a on die D13 is coupled to first power supply contact pad $116a_2$ by wire bond $120_{L1}$. Likewise, power supply bond pads 114b on each of die D9-D16 are coupled to one another by wire bonds $120_S$, power supply bond pad 114b on die D9 is coupled to second power supply contact pad $116b_2$ by wire bond $120_{M2}$, and power supply bond pad 114b on die D13 is coupled to second power supply contact pad $116b_2$ by wire bond $120_{L2}$. Although not visible in FIG. 1B, similar electrical connections are made between first power supply bond pads 114a and second power supply bond pads 114b on die D1-D8 and first power supply contact pad $116a_1$ and second power supply contact pad $116b_1$.

Wire bonds $120_S$ have a relatively short length, wire bonds $120_{M1}$ and $120_{M2}$ have a relatively intermediate length, and wire bonds $120_{L1}$ and $120_{L2}$ have a relatively long length. Each wire bond 120 ($120_S$, $120_{M1}$, $120_{M2}$, $120_{L1}$ and $120_{L2}$) includes parasitic resistance and inductance, each of which increases with increasing wire bond length.

For wire bonds 120 used to couple power (e.g., VDD and GND) from substrate 104 to die 106, the parasitic resistance and inductance of long wire bonds (e.g., wire bond $120_{L1}$ coupling first power supply bond pad 114a on die D13 to first power supply contact pad $116a_2$, and wire bond $120_{L2}$ coupling second power supply bond pad 114b on die D13 to second power supply contact pad $116b_2$ on substrate 104) may become problematic.

In particular, at frequencies above about 300 MHz, the parasitic inductance of long wire bonds begins to dominate, and the impedance profile of the power delivery network becomes inductive, increasing with frequency. As a result, high frequency noise is coupled to the power delivery network, which increases power supply noise and ground bounce, and negatively impacts signal integrity and power integrity for high-stacked integrated circuits such as semiconductor memory devices.

Traditional techniques to improve the power delivery network include adding decoupling capacitors and/or internal voltage regulators on substrate 104. Such conventional techniques are inadequate or undesirable for high-stacked integrated circuits. Adding decoupling capacitors to substrate 104 does not eliminate the long wire bond inductance "seen" by the stacked die 106. In addition, voltage regulators require additional discrete components such as inductors and capacitors, which consume valuable real estate on substrate 104. Voltage regulators also may introduce noise and may cause thermal management problems.

Technology is described for use with high-stacked integrated circuits. A capacitor die including one or more integrated circuit capacitors is disposed between two adjacent die in a die stack above a substrate. In an embodiment, the integrated circuit capacitors may be selectively coupled together to form a desired capacitor value for the capacitor die. In an embodiment, the integrated circuit capacitors include first capacitor plates and second capacitor plates that are coupled to bond pads on the capacitor die. In an embodiment, the bond pads on the capacitor die are coupled to power supply bond pads on one or more die in the die stack. In an embodiment, the number of bond pads on the capacitor die and/or the size of the bond pads are selected to accommodate multiple wire bond connections between the capacitor die and power supply contact pads on the substrate.

Without wanting to be bound by any particular theory, it is believed that increasing the number of parallel wire bond connections between the capacitor die and power supply contact pads on the substrate may reduce an inductance seen by the high-stacked die decoupled by the capacitor die. It is also believed that the parallel wire bonds will provide a low impedance path from the substrate to the high-stacked die. In addition, without wanting to be bound by any particular theory, it is believed that selectively coupling the integrated circuit capacitors to form a desired capacitor value for the capacitor die may form a low impedance profile in the frequency-domain with the parallel wire bond in the power delivery network from the substrate to the die stack, and may reduce power supply noise and ground bounce in the power delivery network.

Figure 2A:
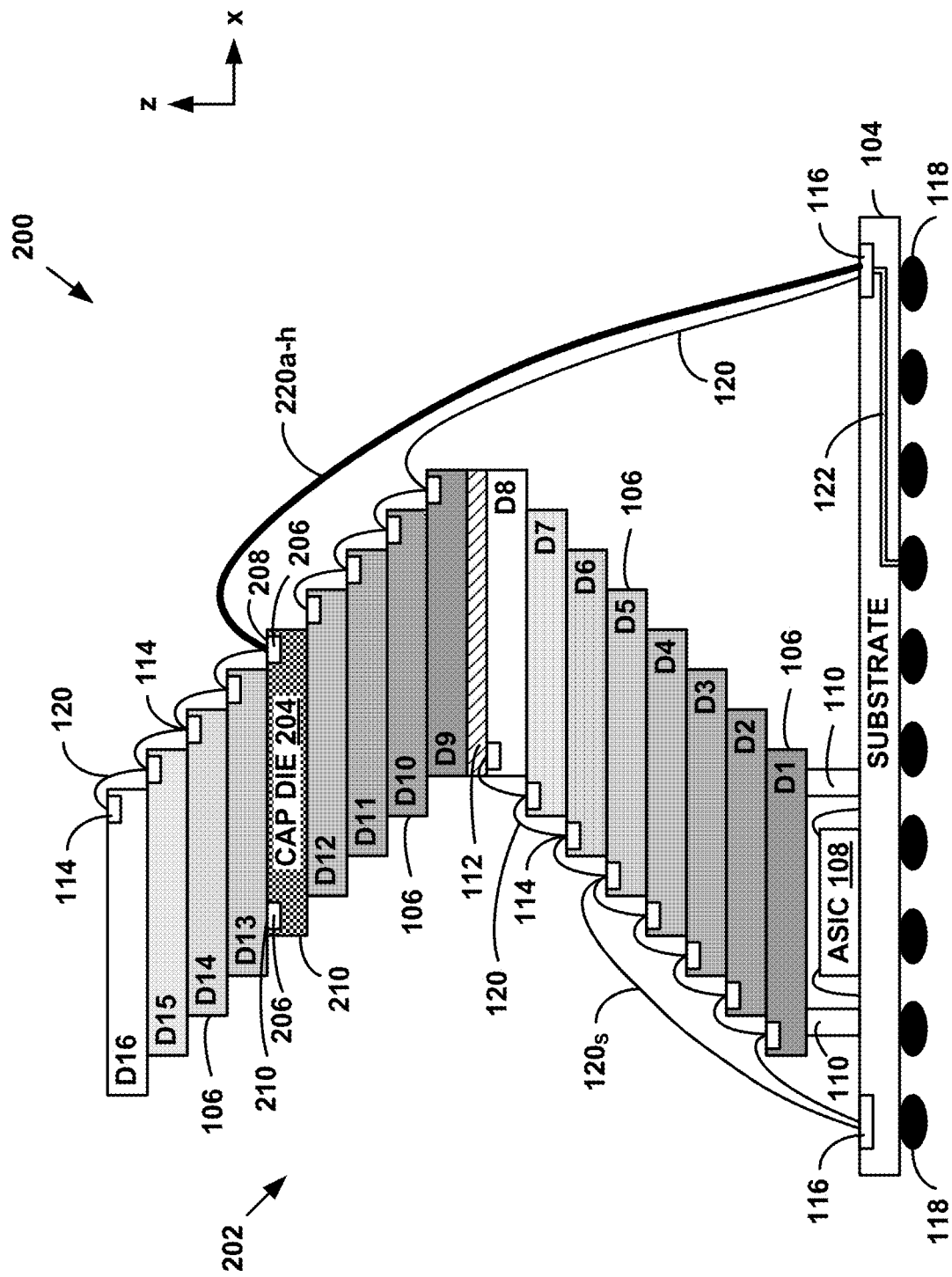
FIG. 2A depicts a side of a semiconductor device that includes a semiconductor die stack and a capacitor die.
Figure 3B:
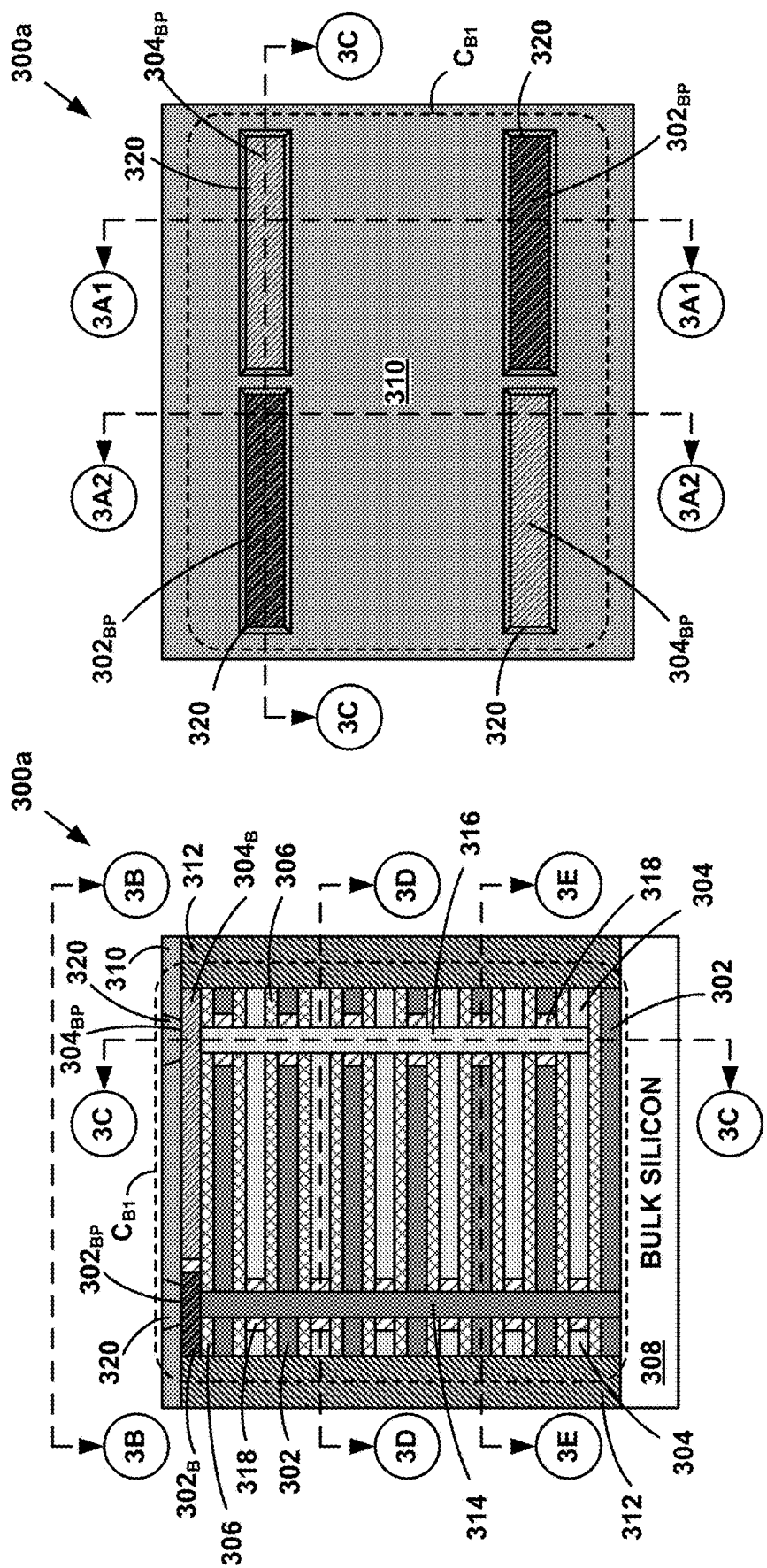
Figure 3E:
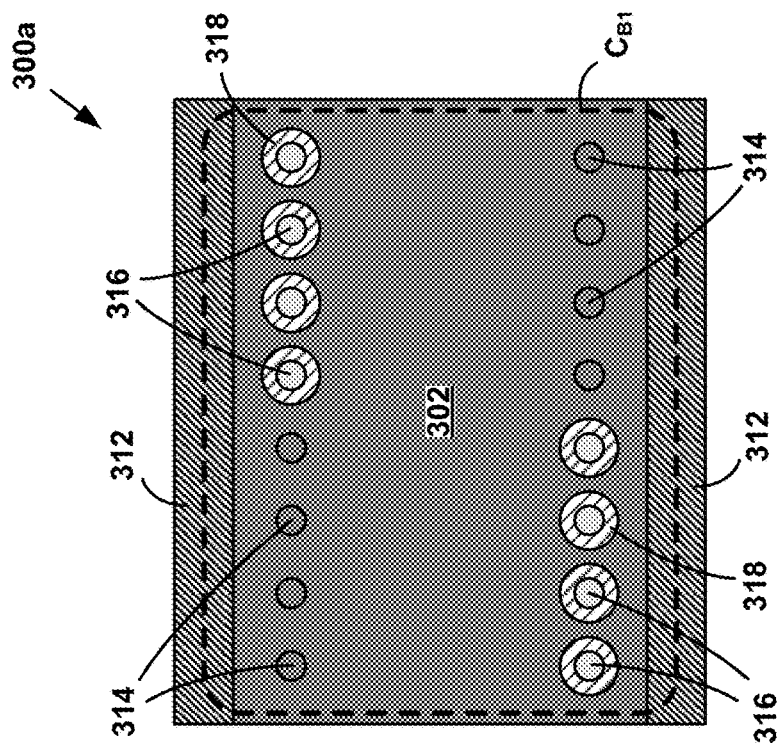
Figure 3D:
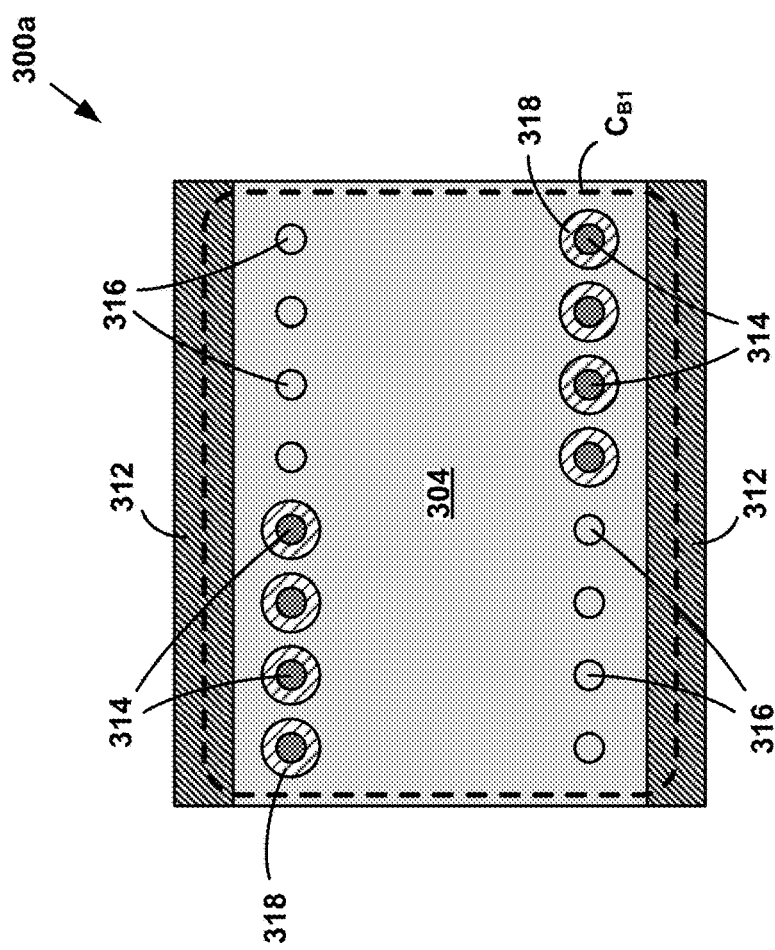
Figure 3J:
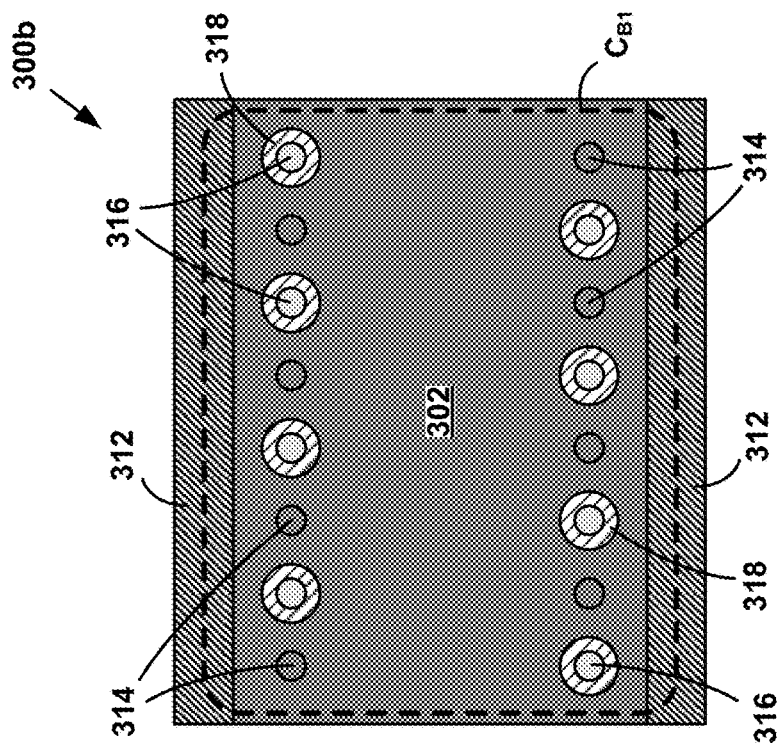
Figure 3I:
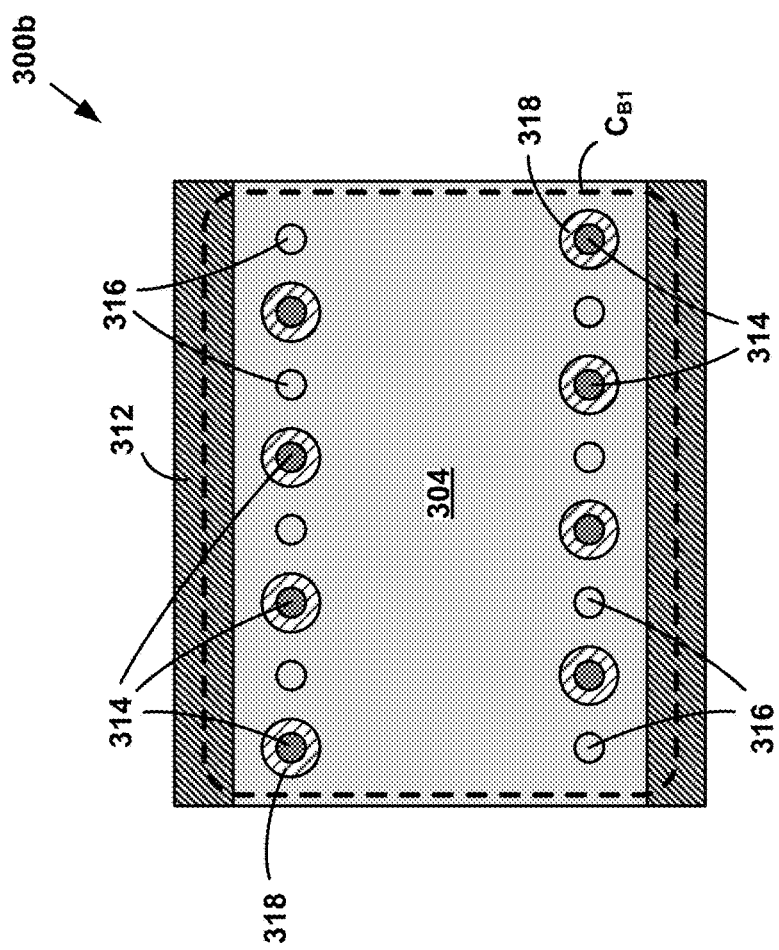
Figure 3M:
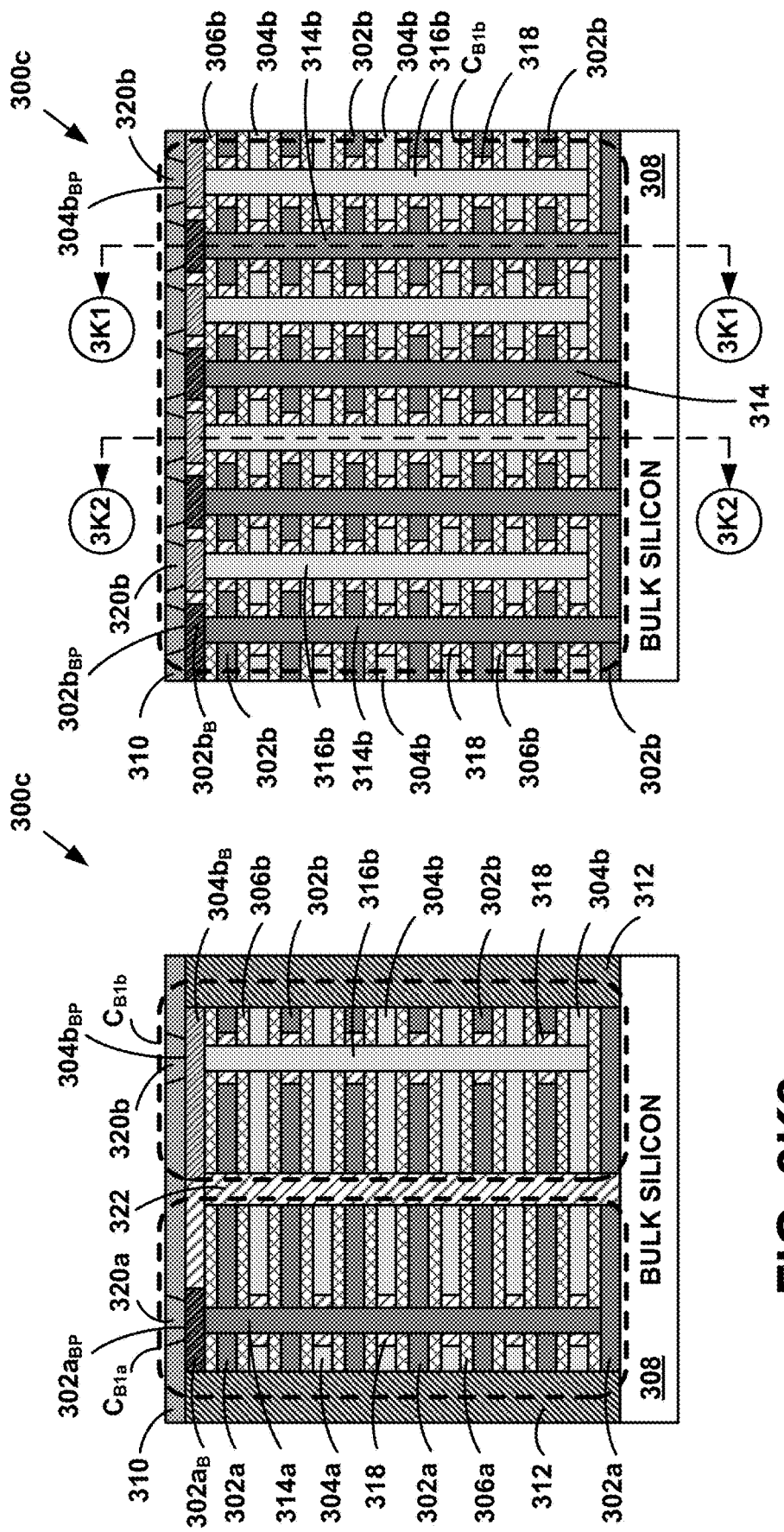
Figure 3Q:
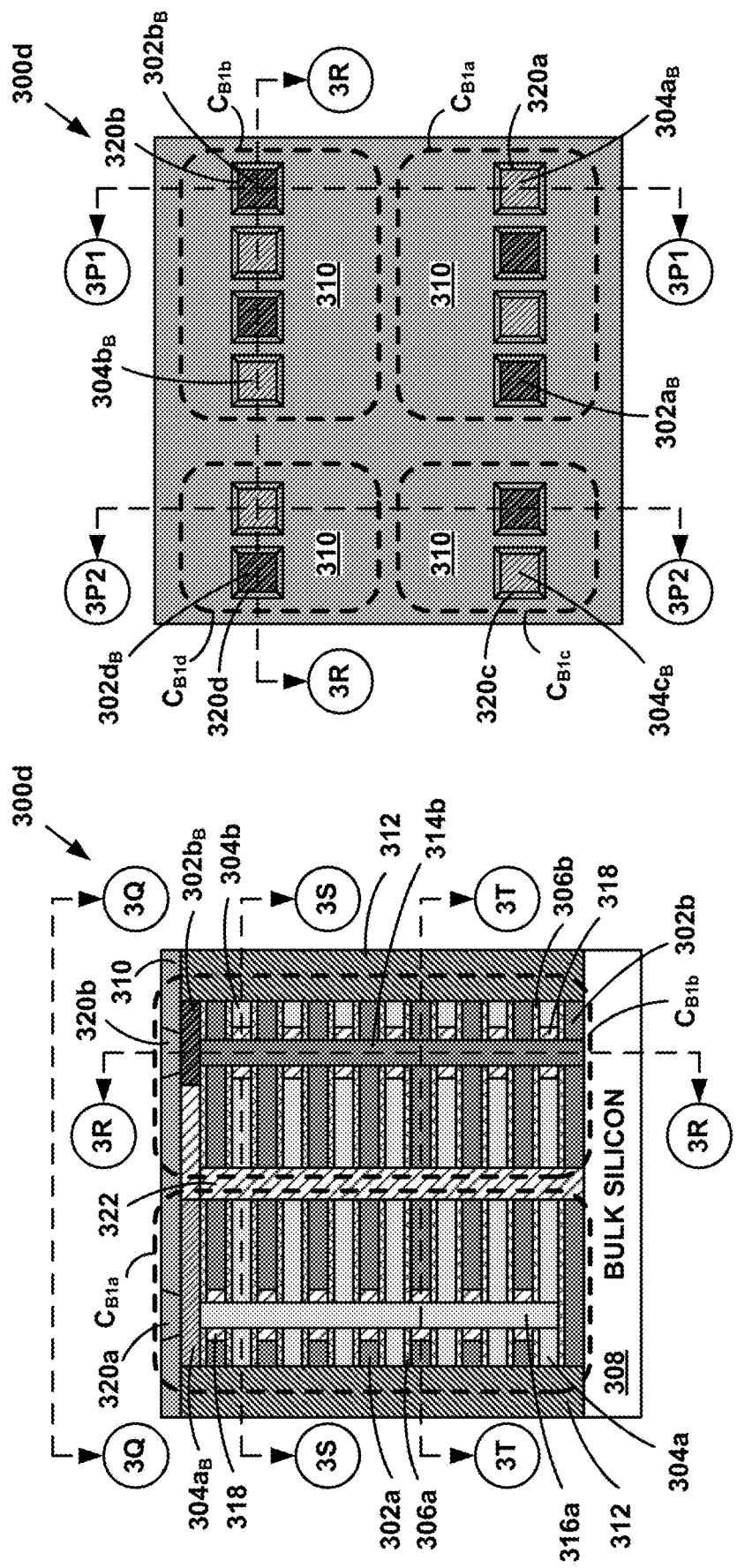
Figure 3T:
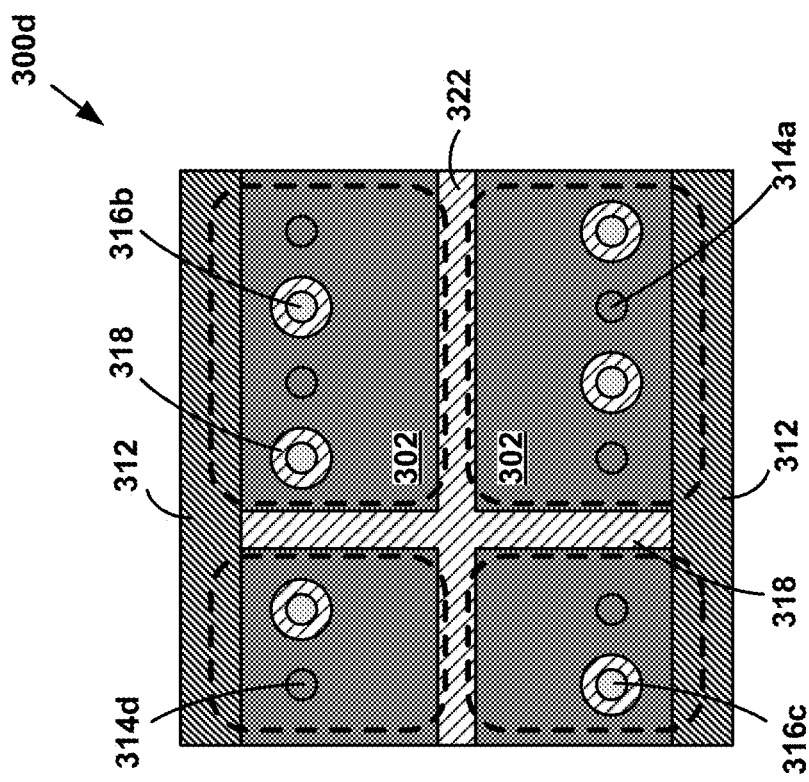
Figure 3S:
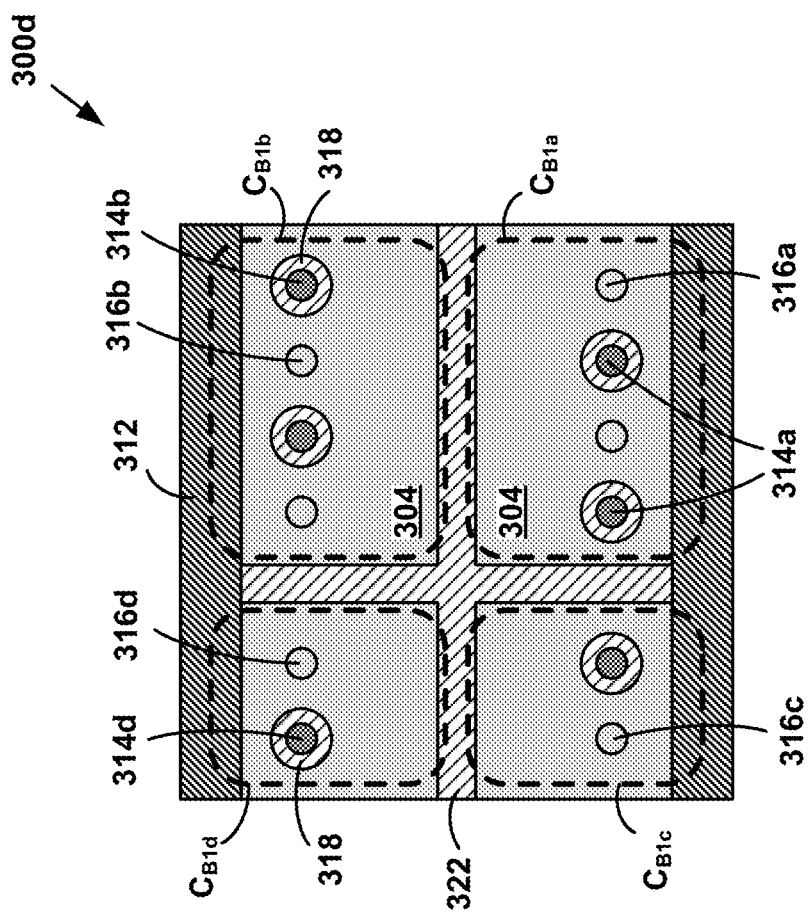

FIG. 2A depicts a side view of a semiconductor device 200 that includes a semiconductor die stack 202 formed on substrate 104. In an embodiment, die stack 202 includes sixteen die 106 (e.g., semiconductor memory die), although more or fewer than sixteen die 106 may be used. ASIC 108 (e.g., a memory controller) is disposed on substrate 104, and die stack 202 is disposed above ASIC 108 on supports 110. Semiconductor device 200 is similar to semiconductor device 100 of FIGS. 1A-1B, but also includes an integrated circuit capacitor die ("Cap Die") 204 in die stack 202.

In an embodiment, Cap Die 204 has substantially the same length and width as die 106, and is disposed between adjacent die 106 (e.g., between die D12 and D13) in die stack 202. In other embodiments, semiconductor device 200 may include more than one Cap Die 204, and/or Cap Die 204 may be disposed on top of die stack or between other die 106 in die stack 202. For example, in another embodiment, Cap Die 204 may be disposed between die D8 and D9 to supply charges to die D1-D8 and die D9-D16.

In embodiments, Cap Die 204 has a length between about 9 mm to about 14 mm, a width between about 2 mm to about 11 mm, and a height between about 10 µm to about 250 µm, although other dimensions may be used based on fabrication capabilities and design need. In an embodiment, bond pads 206 are disposed along a first edge 208 and a second edge 210 of a top surface of Cap Die 204. In other embodiments, bond pads 206 may be disposed along first edge 208 or second edge 210 of a top surface of Cap Die 204. In an embodiment, bond pads 206 are in close physical proximity to bond pads 114 of die D13 and D12.

As described in more detail below, in an embodiment Cap Die 204 includes an integrated circuit capacitor having a first capacitor plate and a second capacitor plate separated by a thin layer of dielectric material similar to the construction of a parallel plate capacitor. The first capacitor plate is coupled to one or more bond pads 206a, which are coupled via one or more wire bonds to first power supply contact pad $116a_2$ on substrate 104, and the second capacitor plate is coupled to one or more bond pads 206b, which are coupled via one or more wire bonds to second power supply contact pad $116b_2$ on substrate 104. In an embodiment, the first capacitor plate is also coupled via a wire bond to first power supply bond pad 114a on a die 106 (e.g., die D13) adjacent to Cap Die 204, and the second capacitor plate is coupled via a wire bond to second power supply bond pad 114b on the adjacent die 106 (e.g., die D13).

In an embodiment, the integrated circuit capacitor of Cap Die 204 has a capacitance value in the micro-Farad range (or larger), much larger than that of capacitors on die 106, which are typically on the order of a few nano-Farads. Without wanting to be bound by any particular theory, it is believed that coupling the first capacitor plate and second capacitor plate of Cap Die 204 very close to the "load" (e.g., die D13) as described above may significantly reduce voltage rail droop, power supply noise and ground bounce in semiconductor devices that include high stacks of semiconductor die, such as die stack 202.

FIG. 2B1 is a top view of an embodiment of semiconductor device 200 of FIG. 2A. In this embodiment, semiconductor device 200a includes a Cap Die 204a that includes an integrated circuit capacitor having a first capacitor plate (not shown) coupled to first bond pads 206a, and a second capacitor plate (not shown) coupled to second bond pads 206b. In an embodiment, Cap Die 204a includes four first bond pads 206a and four second bond pads 206b, although more or fewer than four first bond pads 206a and four second bond pads 206b may be used.

To provide power to die D9-D12, first power supply bond pads 114a on each of die D9-D12 are coupled to one another by wire bonds $120_S$, second power supply bond pads 114b on each of die D9-D12 are coupled to one another by wire bonds $120_S$, first power supply bond pad 114a on die D9 is coupled to first power supply contact pad $116a_2$ by wire bond $120_{M1}$, and second power supply bond pad 114b on die D9 is coupled to second power supply contact pad $116b_2$ by wire bond $120_{M2}$.

To provide power to die D13-D16, first power supply bond pads 114a on each of die D13-D16 are coupled to one another by wire bonds $120_S$, second power supply bond pads 114b on each of die D13-D16 are coupled to one another by wire bonds $120_S$, first power supply bond pad 114a on die D13 is coupled to one or more of first bond pads 206a of Cap Die 204a, second power supply bond pad 114b on die D13 is coupled to one or more of second bond pads 206b of Cap Die 204a, first bond pads 206a of Cap Die 204a are coupled to first power supply contact pad $116a_2$ by wire bonds $220_a$-$220_d$, and second bond pads 206b of Cap Die 204a are coupled to second power supply contact pad $116b_2$ by wire bonds $220_e$-$220_h$.

By virtue of these electrical connections, the integrated circuit capacitor of Cap Die 204a is coupled in parallel across first power supply bond pads 114a and second power supply bond pads 114b of die D9-D12, and functions as a power supply bypass capacitor. Without wanting to be bound by any particular theory, it is believed that Cap Die 204a acts like a small battery that bypasses the long wire bonds $220_a$-$220_d$ and wire bonds $220_e$-$220_h$, and may reduce power supply noise and ground bounce.

In addition, because Cap Die 204a includes multiple bond pads 206a and 206b coupled to each of the first capacitor plate and the second capacitor plate, multiple wire bonds $220_a$-$220_d$ may be coupled between first bond pads 206a of Cap Die 204a and first power supply contact pad $116a_2$ by wire bonds $220_a$-$220_d$, and multiple wire bonds $220_e$-$220_h$ may be coupled between second bond pads 206b and second power supply contact pad $116b_2$ to reduce the inductance of such long wire bond connections. Indeed, by selectively controlling the number of wire bonds 220 coupled between bond pads 206 of Cap Die 204a and first power supply contact pad $116a_2$ and second power supply contact pad $116b_2$, the inductance of wire bonds 220 can be tuned to achieve a desired inductance value.

In an alternative embodiment (not shown in FIG. 2B1), to provide power to die D9-D16, first power supply bond pads 114a on each of die D9-D16 are coupled to one another by wire bonds $120_S$, second power supply bond pads 114b on each of die D9-D16 are coupled to one another by wire bonds $120_S$, first power supply bond pad 114a on die D13 is coupled to one or more of first bond pads 206a of Cap Die 204a, second power supply bond pad 114b on die D13 is coupled to one or more of second bond pads 206b of Cap Die 204a, first bond pads 206a of Cap Die 204a are coupled to first power supply contact pad $116a_2$ by wire bonds $220_a$-$220_d$, and second bond pads 206b of Cap Die 204a are coupled to second power supply contact pad $116b_2$ by wire bonds $220_e$-$220_h$. This configuration eliminates the need to couple first power supply bond pad 114a on die D9 to first power supply contact pad $116a_2$ by wire bond $120_{M1}$, and second power supply bond pad 114b on die D9 to second power supply contact pad $116b_2$ by wire bond $120_{M2}$.

As described above, in an embodiment Cap Die 204a includes an integrated circuit capacitor having a first capacitor plate coupled to first bond pads 206a, and a second capacitor plate coupled to second bond pads 206b. FIG. 2C1 depicts a simplified schematic diagram of an embodiment of Cap Die $204a_1$ that includes two sets of first bond pads $206a_1$-$206a_4$, two sets of second bond pads $206b_1$-$206b_4$, and a single integrated circuit capacitor $C_{B1}$ having a first capacitor plate coupled to first bond pads $206a_1$-$206a_4$, and a second capacitor plate coupled to second bond pads $206b_1$-$206b_4$. In an embodiment, a first set of first bond pads $206a_1$-$206a_4$ and a first set of second bond pads $206b_1$-$206b_4$ are disposed adjacent a first side of Cap Die $204a_1$, and a second set of first bond pads $206a_1$-$206a_4$ and a second set of second bond pads $206b_1$-$206b_4$ are disposed adjacent a second side of Cap Die 204a1.

In this embodiment, Cap Die 204a1 has a fixed capacitor value (e.g., $C_{B1}$=C), and the number of wire bonds 220 coupled between bond pads 206 of Cap Die 204a1 and first power supply contact pad $116a_2$ and second power supply contact pad $116b_2$ can be selectively chosen to tune the inductance of wire bonds 220 to achieve a desired inductance value in conjunction with the fixed capacitor value $C_{B1}$=C. In this embodiment, two sets of first bond pads $206a_1$-$206a_4$ and two sets of second bond pads $206b_1$-$206b_4$ are used to allow wire bonds 220 to be connected on either side of Cap Die 204a. In other embodiments, a single set of first bond pads $206a_1$-$206a_4$ and a single set of second bond pads $206b_1$-$206b_4$ may be used, and/or more or fewer than eight first bond pads $206a_1$-$206a_4$ and eight second bond pads $206b_1$-$206b_4$ may be used.

FIG. 2C2 depicts a simplified schematic diagram of an embodiment of Cap Die $204a_2$ that includes two sets of first bond pads $206a_1$-$206a_4$, two sets of second bond pads $206b_1$-$206b_4$, and a single integrated circuit capacitor $C_{B1}$ having a first capacitor plate coupled to both sets of first bond pads $206a_1$-$206a_4$, and a second capacitor plate coupled to both sets of second bond pads $206b_1$-$206b_4$. In this embodiment, first bond pads $206a_1$-$206a_4$ alternate with second bond pads $206b_1$-$206b_4$. In an embodiment, a first set of first bond pads $206a_1$-$206a_4$ and a first set of second bond pads $206b_1$-$206b_4$ are disposed adjacent a first side of Cap Die 204a2, and a second set of first bond pads $206a_1$-$206a_4$ and a second set of second bond pads $206b_1$-$206b_4$ are disposed adjacent a second side of Cap Die 204a2.

In this embodiment, Cap Die 204a2 has a fixed capacitor value (e.g., $C_{B1}$=C), and the number of wire bonds 220 coupled between bond pads 206 of Cap Die 204a2 and first power supply contact pad $116a_2$ and second power supply contact pad $116b_2$ can be selectively chosen to tune the inductance of wire bonds 220 to achieve a desired inductance value in conjunction with the fixed capacitor value $C_{B1}$=C. In other embodiments, a single set of first bond pads $206a_1$-$206a_4$ and a single set of second bond pads $206b_1$-$206b_4$ may be used, and/or more or fewer than eight first bond pads $206a_1$-$206a_4$ and eight second bond pads $206b_1$-$206b_4$ may be used.

FIG. 2C3 depicts a simplified schematic diagram of an embodiment of Cap Die 204a3 that includes first bond pads $206a_1$-$206a_4$, second bond pads $206b_1$-$206b_4$, third bond pads $206c_1$-$206c_4$, fourth bond pads $206d_1$-$206d_4$, a first integrated circuit capacitor $C_{B1a}$ having a first capacitor plate coupled to first bond pads $206a_1$-$206a_4$, and a second capacitor plate coupled to second bond pads $206b_1$-$206b_4$, and a second integrated circuit capacitor $C_{B1b}$ having a first capacitor plate coupled to third bond pads $206c_1$-$206c_4$, and a second capacitor plate coupled to fourth bond pads $206d_1$-$206d_4$. In an embodiment, first bond pads $206a_1$-$206a_4$ and second bond pads $206b_1$-$206b_4$ are disposed adjacent a first side of Cap Die 204a3, and third bond pads $206a_1$-$206a_4$ and fourth bond pads $206b_1$-$206b_4$ are disposed adjacent a second side of Cap Die 204a3.

In this embodiment, Cap Die 204a3 has fixed capacitor values (e.g., $C_{B1a}$=C1, $C_{B1b}$=C2), and the number of wire bonds 220 coupled between bond pads 206 of Cap Die 204a3 and first power supply contact pad $116a_2$ and second power supply contact pad $116b_2$ can be selectively chosen to tune the inductance of wire bonds 220 to achieve a desired inductance value in conjunction with the fixed capacitor values $C_{B1}a$=C1 and $C_{B1b}$=C2. In an embodiment, C1=C2, but in other embodiments C1 and C2 may have different values.

FIG. 2C4 depicts a simplified schematic diagram of an embodiment of a Cap Die $204a_4$ that includes a first integrated circuit capacitor $C_{B1}$ having a first capacitor plate coupled to first bond pad $206a_1$ and a second capacitor plate coupled to second bond pad $206b_1$, a second integrated circuit capacitor $C_{B2}$ having a first capacitor plate coupled to first bond pad $206a_2$ and a second capacitor plate coupled to second bond pad $206b_2$, a third integrated circuit capacitor $C_{B3}$ having a first capacitor plate coupled to first bond pad $206a_3$ and a second capacitor plate coupled to second bond pad $206b_3$, and a fourth integrated circuit capacitor $C_{B4}$ having a first capacitor plate coupled to first bond pad $206a_4$ and a second capacitor plate coupled to second bond pad $206b_4$. In other embodiments, two sets of first bond pads 206a and two second bonds pad 206b may be used.

In embodiments, integrated circuit capacitors $C_{B1}$-$C_{B4}$ each have the same value (e.g., $C_{B1}$=$C_{B2}$=$C_{B3}$=$C_{B4}$=C), or may have different values (e.g., $C_{B1}$=C, $C_{B2}$=2C, $C_{B3}$=4C, $C_{B4}$=8C), and a desired capacitor value may be selected by selectively coupling wire bonds to first bond pads $206a_1$-$206a_4$ and second bond pads $206b_1$-$206b_4$. For example, if $C_{B1}$=C, $C_{B2}$=2C, $C_{B3}$=4C, $C_{B4}$=8C, Cap Die $204a_4$ may be selectively configured to provide capacitor values C, 2C, 3C, . . . , 14C, 15C.

In an embodiment, first bond pads $206a_1$-$206a_4$ and second bond pads $206b_1$-$206b_4$ are each sized to accommodate multiple wire bonds, and the number of wire bonds 220 coupled between bond pads 206 of Cap Die $204a_4$ and first power supply contact pad $116a_2$ and second power supply contact pad $116b_2$ can be selectively chosen to tune the inductance of wire bonds 220 to achieve a desired inductance value in conjunction with the selectable capacitor values C, 2C, 3C, . . . , 14C, 15C. In this regard, the capacitor and inductance values both may be selected to achieve a low impedance profile in the frequency-domain as needed for the power delivery network. In other embodiments, two sets of first bond pads $206a_1$-$206a_4$ and two sets of second bonds pads $206b_1$-$206b_4$ may be used.

FIG. 2B2 is a top view of an embodiment of semiconductor device 200 of FIG. 2A. In this embodiment, semiconductor device 200b includes a Cap Die 204b that includes an integrated circuit capacitor having a first capacitor plate (not shown) coupled to first bond pad 206a, and a second capacitor plate (not shown) coupled to second bond pad 206b. In an embodiment, Cap Die 204b includes one first bond pad 206a and one second bond pad 206b, although more or fewer than one first bond pad 206a and one second bond pad 206b may be used. In an embodiment, first bond pad 206a and second bond pad 206b are each sized to accommodate multiple wire bonds (e.g., 2 or more wire bonds).

Power to die D9-D12 is provided in the same manner as in FIG. 2B1. To provide power to die D13-D16, first power supply bond pads 114a on each of die D13-D16 are coupled to one another by wire bonds $120_S$, second power supply bond pads 114b on each of die D13-D16 are coupled to one another by wire bonds $120_S$, first power supply bond pad 114a on die D13 is coupled to first bond pad 206a of Cap Die 204b, second power supply bond pad 114b on die D13 is coupled to second bond pad 206b of Cap Die 204b, first bond pad 206a of Cap Die 204b is coupled to first power supply contact pad $116a_2$ by wire bonds $220_a$-$220_d$, and second bond pad 206b of Cap Die 204b is coupled to second power supply contact pad $116b_2$ by wire bonds $220_e$-$220_h$.

By virtue of these electrical connections, the integrated circuit capacitor of Cap Die 204b is coupled in parallel across first power supply bond pads 114a and second power supply bond pads 114b of die D9-D12, and functions as a power supply bypass capacitor. Without wanting to be bound by any particular theory, it is believed that Cap Die 204b may function as a close-by electric charge reservoir (such as a small battery) that bypasses the long wire bonds $220_a$-$220_d$ and wire bonds $220_e$-$220_h$ to supply the need of the load (e.g., die D13-D16) and may reduce power supply noise and ground bounce.

In addition, because Cap Die 204b includes bond pads 206a and 206b that are each sized to accommodate multiple wire bonds, multiple wire bonds $220_a$-$220_d$ may be coupled between first bond pad 206a of Cap Die 204b and first power supply contact pad $116a_2$ by wire bonds $220_a$-$220_d$, and multiple wire bonds $220_e$-$220_h$ may be coupled between second bond pad 206b and second power supply contact pad $116b_2$ to lower the inductance of such long wire bond connections. Indeed, by selectively controlling the number of wire bonds 220 coupled between first bond pad 206a and second bond pad 206b of Cap Die 204b and first power supply contact pad $116a_2$ and second power supply contact pad $116b_2$, the inductance of wire bonds 220 can be tuned to achieve a desired inductance value.

As described above, in an embodiment Cap Die 204b includes an integrated circuit capacitor having a first capacitor plate coupled to first bond pad 206a, and a second capacitor plate coupled to second bond pad 206b. FIG. 2C5 depicts a simplified schematic diagram of an embodiment of Cap Die $204b_1$ that includes first bond pads 206a, second bond pad 206b, and a single integrated circuit capacitor $C_{B1}$ having a first capacitor plate coupled to first bond pads 206a and a second capacitor plate coupled to second bond pads 206b. In an embodiment, first bond pads 206 and second bond pads 206b are disposed adjacent a first side of Cap Die $204a_1$ and a second side of Cap Die $204a_1$.

In this embodiment, Cap Die $204b_1$ has a fixed capacitor value (e.g., $C_{B1}$=C), and the number of wire bonds 220 coupled between bond pads 206 of Cap Die $204b_1$ and first power supply contact pad $116a_2$ and second power supply contact pad $116b_2$ can be selectively chosen to tune the inductance of wire bonds 220 to achieve a desired inductance value in conjunction with the fixed capacitor value $C_{B1}$=C. In other embodiments, a single first bond pad 206a and a single second bond pad 206b may be used.

FIG. 2C6 depicts a simplified schematic diagram of another alternative embodiment of Cap Die $204b_2$ that includes first integrated circuit capacitor $C_{B1}$, second integrated circuit capacitor $C_{B2}$, third integrated circuit capacitor $C_{B3}$, fourth integrated circuit capacitor $C_{B4}$, first bond pad 206a, second bond pad $206b_2$, and switches 212a-212d. First integrated circuit capacitor $C_{B1}$ has a first capacitor plate coupled to first bond pad 206a and a second capacitor plate coupled via switch 212a to second bond pad 206b. Second integrated circuit capacitor $C_{B2}$ has a first capacitor plate coupled to first bond pad 206a and a second capacitor plate coupled via switch 212b to second bond pad 206b. Third integrated circuit capacitor $C_{B3}$ has a first capacitor plate coupled to first bond pad 206a and a second capacitor plate coupled via switch 212c to second bond pad 206b. Fourth integrated circuit capacitor $C_{B4}$ has a first capacitor plate coupled to first bond pad 206a and a second capacitor plate coupled via switch 212d to second bond pad 206b.

In embodiments, integrated circuit capacitors $C_{B1}$-$C_{B4}$ each have the same value (e.g., $C_{B1}=C_{B2}=C_{B3}=C_{B4}=C$), or may have different values (e.g., $C_{B1}=C$, $C_{B2}=2C$, $C_{B3}=4C$, $C_{B4}=8C$), and a desired capacitor value may be selected by selectively configuring switches 212a-212d to couple second capacitor plates of first integrated circuit capacitor $C_{B1}$, second integrated circuit capacitor $C_{B2}$, third integrated circuit capacitor $C_{B3}$, and fourth integrated circuit capacitor $C_{B4}$ to second bond pad 206b. For example, if $C_{B1}=C$, $C_{B2}=2C$, $C_{B3}=4C$, $C_{B4}=8C$, Cap Die $204b_2$ may be selectively configured to provide capacitor values C, 2C, 3C, . . . , 14C, 15C.

In addition, because first bond pad 206a and second bond pad 206b are sized individually to accommodate multiple wire bonds, the number of wire bonds 220 coupled between first bond pad 206a and second bond pad 206b of Cap Die $204b_2$ and first power supply contact pad $116a_2$ and second power supply contact pad $116b_2$ can be selectively chosen to tune the inductance of wire bonds 220 to achieve a desired inductance value in conjunction with the selectable capacitor values C, 2C, 3C, . . . , 14C, 15C. In this regard, the capacitor and inductance values both may be selected to achieve a low impedance profile in the frequency-domain as needed for the power delivery network. In other embodiments, two first bond pads 206a and two second bonds pad 206b may be used.

FIGS. 3A1-3E depict various views of an embodiment of a Cap Die 300a, which is an example implementation of Cap Die 204 of FIG. 2A, Cap Die 204b of FIG. 2B2 and Cap Die $204b_1$ of FIG. 2C5. Cap Die 300a includes an integrated circuit capacitor $C_{B1}$ that includes a stack of alternating first conductive layers 302 and second conductive layers 304, separated by capacitor dielectric layers 306, all formed above a substrate 308 (e.g., bulk silicon). First conductive bond layers $302_B$ and second conductive bond layers $304_B$ are disposed above the stack of alternating first conductive layers 302 and second conductive layers 304.

In an embodiment, first conductive layers 302 constitute a first capacitor plate of integrated circuit capacitor $C_{B1}$ and second conductive layers 304 constitute a second capacitor plate of integrated circuit capacitor $C_{B1}$. A dielectric material layer 310 (e.g., polyimide or other suitable dielectric material layer) is formed above first conductive bond layers $302_B$ and second conductive bond layers $304_B$, and dielectric material layers 312 (e.g., $SiO_2$ or other suitable dielectric material) are disposed on opposite ends of the stack.

First conductive layers 302, second conductive layers 304, first conductive bond layers $302_B$ and second conductive bond layers $304_B$ each may include any suitable conductive material deposited by any suitable method (e.g., CVD, PVD, etc.). In an embodiment, each first conductive layer 302 is about 20 nm of tungsten, each second conductive layer 304 is about 20 nm of tungsten, each first conductive bond layer $302_B$ is about 20 nm of aluminum, and each second conductive bond layer $304_B$ is about 20 nm of aluminum. Other conductive layer materials and/or thicknesses may be used.

Capacitor dielectric layers 306 are a high-K dielectric material, such as $SiN_x$, $Ta_2O_5$, $Al_2O_3$, $ZrO_2$, $HfO_2$, or other similar dielectric material. In an embodiment, each capacitor dielectric layer 306 may be about 15 nm of $SiN_x$. Other dielectric materials and/or thicknesses may be used. The higher the dielectric constant used and/or the thinner the dielectric material, the higher the capacitance. Hence the dielectric material property and thickness are the two design parameters to be considered for the design need. These parameters also can vary from layer to layer in this multilayer structure providing further design flexibility.

First conductive vias 314 extend through the stack of first conductive layers 302, second conductive layers 304 and capacitor dielectric layers 306, and connect to first conductive layers 302 and first conductive bond layers $302_B$. In this regard, first conductive bond layers $302_B$ are coupled to the first capacitor plate of integrated circuit capacitor $C_{B1}$. Second conductive vias 316 extend through the stack of first conductive layers 302, second conductive layers 304 and capacitor dielectric layers 306, and connect to second conductive layers 304 and second conductive bond layers $304_B$. In this regard, second conductive bond layers $304_B$ are coupled to the second capacitor plate of integrated circuit capacitor $C_{B1}$. First conductive vias 314 may be the same material as first conductive layers 302, or may be a different conductive material. Second conductive vias 316 may be the same material as second conductive layers 304, or may be a different conductive material.

Dielectric spacers 318 (e.g., $SiO_2$ or other suitable dielectric material) surround and insulate first conductive vias 314 from second conductive layers 304, and surround and insulate second conductive vias 316 from first conductive layers 302. Openings 320 in dielectric material layer 310 expose portions of first conductive bond layers $302_B$ and second conductive bond layers $304_B$, with the exposed portions forming first bond pads $302_{BP}$ and second bond pads $304_{BP}$, respectively. In an embodiment, openings 320 have a rectangular shape, although other shapes may be used. In an embodiment, first bond pads $302_{BP}$ and second bond pads $304_{BP}$ are configured to accommodate multiple wire bonds. Cap Die 300a includes two first bond pads $302_{BP}$ and two second bond pads $304_{BP}$. In other embodiments, more or fewer than two first bond pads $302_{BP}$ and two second bond pads $304_{BP}$ may be used.

For example, FIGS. 3F1-3J depict various views of an embodiment of a Cap Die 300b, which is an example implementation of Cap Die 204 of FIG. 2A and Cap Die $204a2$ of FIG. 2C2. Cap Die 300b includes integrated circuit capacitor $C_{B1}$, and is similar to Cap Die 300a of FIGS. 3A1-3E, except first conductive vias 314 alternate with second conductive vias 316 on each side of Cap Die 300b. In addition, Cap Die 300b includes eight first bond pads $302_{BP}$ and eight second bond pads $304_{BP}$. In other embodiments, more or fewer than eight first bond pads $302_{BP}$ and eight second bond pads $304_{BP}$ may be used.

FIGS. 3K1-3O depict various views of an embodiment of a Cap Die 300c, which is an example implementation of Cap Die 204 of FIG. 2A and Cap Die $204a3$ of FIG. 2C3. Cap Die 300c is similar to Cap Die 300b of FIGS. 3F1-3J, but includes integrated circuit capacitors $C_{B1a}$ and $C_{B1b}$ on each side of Cap Die 300b. In particular, Cap Die 300c includes an integrated circuit capacitor $C_{B1a}$ that includes a first stack of alternating first conductive layers 302a and second conductive layers 304a, separated by capacitor dielectric layers 306a, all formed above substrate 308, and an integrated circuit capacitor $C_{B1b}$ that includes a second stack of alternating first conductive layers 302b and second conductive layers 304b, separated by capacitor dielectric layers 306b, all formed above substrate 308.

First conductive bond layers $302a_B$ and second conductive bond layers $304a_B$ are disposed above the first stack of alternating first conductive layers 302a and second conductive layers 304a. First conductive bond layers $302b_B$ and second conductive bond layers $304b_B$ are disposed above the second stack of alternating first conductive layers 302b and second conductive layers 304b. In an embodiment, a dielectric material layer 322 (e.g., SiO$_2$ or other similar dielectric material) is disposed between first conductive layers 302a and 302b, between second conductive layers 304a and 304b, and between capacitor dielectric layers 306a and 306b.

In an embodiment, first conductive layers 302a constitute a first capacitor plate of integrated circuit capacitor $C_{B1a}$ and second conductive layers 304a constitute a second capacitor plate of integrated circuit capacitor $C_{B1a}$, and first conductive layers 302b constitute a first capacitor plate of integrated circuit capacitor $C_{B1b}$ and second conductive layers 304b constitute a second capacitor plate of integrated circuit capacitor $C_{B1b}$.

First conductive layers 302a-302b, second conductive layers 304a-304b, first conductive bond layers 302a$_B$-302b$_B$, and second conductive bond layers 304a$_B$-304b$_B$ each may include any suitable conductive material deposited by any suitable method (e.g., CVD, PVD, etc.). In an embodiment, each first conductive layer 302a-302b is about 20 nm of tungsten, each second conductive layer 304a-304b is about 20 nm of tungsten, each first conductive bond layer 302a$_B$-302b$_B$ is about 20 nm of aluminum, and each second conductive bond layer 304a$_B$-304a$_B$ is about 20 nm of aluminum. Other conductive layer materials and/or thicknesses may be used.

Capacitor dielectric layers 306a-306b are a high-K dielectric material, such as SiN$_x$, Ta$_2$O$_5$, Al$_2$O$_3$, ZrO$_2$, HfO$_2$, or other similar dielectric material. In an embodiment, each capacitor dielectric layer 306a-306b may be about 15 nm of SiN$_x$. Other dielectric materials and/or thicknesses may be used. The higher the dielectric constant used and/or the thinner the dielectric material, the higher the capacitance. Hence the dielectric material property and thickness are the two design parameters to be considered for the design need. These parameters also can vary from layer to layer in this multi-layer structure providing further design flexibility.

First conductive vias 314a extend through the first stack of first conductive layers 302a and second conductive layers 304a and capacitor dielectric layers 306a, and connect to first conductive layers 302a and first conductive bond layers 302a$_B$. In this regard, first conductive bond layers 302a$_B$ are coupled to the first capacitor plate of integrated circuit capacitor $C_{B1a}$. Second conductive vias 316a extend through the first stack of first conductive layers 302a, second conductive layers 304a and capacitor dielectric layers 306a, and connect to second conductive layers 304a and second conductive bond layers 304a$_B$. In this regard, second conductive bond layers 304a$_B$ are coupled to the second capacitor plate of integrated circuit capacitor $C_{B1a}$. First conductive vias 314a may be the same material as first conductive layers 302a, or may be a different conductive material. Second conductive vias 316a may be the same material as second conductive layers 304a, or may be a different conductive material.

Openings 320a in dielectric material layer 310 expose portions of first conductive bond layers 302a$_B$ and second conductive bond layers 304a$_B$, with the exposed portions forming first bond pads 302a$_{BP}$ and second bond pads 304a$_{BP}$, respectively. In an embodiment, openings 320a have a rectangular shape, although other shapes may be used.

First conductive vias 314b extend through the second stack of first conductive layers 302b and second conductive layers 304b and capacitor dielectric layers 306b, and connect to first conductive layers 302b and first conductive bond layers 302b$_B$. In this regard, first conductive bond layers 302b$_B$ are coupled to the first capacitor plate of integrated circuit capacitor $C_{B1b}$. Second conductive vias 316b extend through the second stack of first conductive layers 302b and second conductive layers 304b and capacitor dielectric layers 306b, and connect to second conductive layers 304b and second conductive bond layers 304n$_B$. In this regard, second conductive bond layers 304b$_B$ are coupled to the second capacitor plate of integrated circuit capacitor $C_{B1b}$. First conductive vias 314b may be the same material as first conductive layers 302b, or may be a different conductive material. Second conductive vias 316b may be the same material as second conductive layers 304b, or may be a different conductive material.

Openings 320b in dielectric material layer 310 expose portions of first conductive bond layers 302bB and second conductive bond layers 304b$_B$, with the exposed portions forming first bond pads 302b$_{BP}$ and second bond pads 304b$_{BP}$, respectively. In an embodiment, openings 320b have a rectangular shape, although other shapes may be used.

FIGS. 3P1-3T depict various views of an embodiment of a Cap Die 300d, which is an example implementation of Cap Die 204 of FIG. 2A. Cap Die 300d is similar to Cap Die 300c of FIGS. 3K1-3O, but includes four integrated circuit capacitors: $C_{B1a}$, $C_{B1b}$, $C_{B1c}$ and $C_{B1d}$. In particular, Cap Die 300d includes an integrated circuit capacitor $C_{B1a}$ that includes a first stack of alternating first conductive layers 302a and second conductive layers 304a, separated by capacitor dielectric layers 306a, an integrated circuit capacitor $C_{B1b}$ that includes a second stack of alternating first conductive layers 302b and second conductive layers 304b, separated by capacitor dielectric layers 306b, an integrated circuit capacitor $C_{B1c}$ that includes a third stack of alternating first conductive layers 302c and second conductive layers 304c, separated by capacitor dielectric layers 306c, and an integrated circuit capacitor $C_{B1d}$ that includes a fourth stack of alternating first conductive layers 302d and second conductive layers 304d, separated by capacitor dielectric layers 306d, all formed above substrate 308.

First conductive bond layers 302a$_B$ and second conductive bond layers 304a$_B$ are disposed above the first stack of alternating first conductive layers 302a and second conductive layers 304a. First conductive bond layers 302b$_B$ and second conductive bond layers 304b$_B$ are disposed above the second stack of alternating first conductive layers 302b and second conductive layers 304b. First conductive bond layers 302c$_B$ and second conductive bond layers 304c$_B$ are disposed above the third stack of alternating first conductive layers 302c and second conductive layers 304c. First conductive bond layers 302d$_B$ and second conductive bond layers 304d$_B$ are disposed above the fourth stack of alternating first conductive layers 302d and second conductive layers 304d. In an embodiment, dielectric material layer 322 is disposed between first conductive layers 302a, 302b, 302c and 302d, between second conductive layers 304a, 304b, 304c and 304d, and between capacitor dielectric layers 306a, 306b, 306c and 306d.

In an embodiment, first conductive layers 302a constitute a first capacitor plate of integrated circuit capacitor $C_{B1a}$ and second conductive layers 304a constitute a second capacitor plate of integrated circuit capacitor $C_{B1a}$, first conductive layers 302b constitute a first capacitor plate of integrated circuit capacitor $C_{B1b}$ and second conductive layers 304b constitute a second capacitor plate of integrated circuit capacitor $C_{B1b}$, first conductive layers 302c constitute a first capacitor plate of integrated circuit capacitor $C_{B1c}$ and second conductive layers 304c constitute a second capacitor plate of integrated circuit capacitor $C_{B1c}$, and first conductive layers 302d constitute a first capacitor plate of integrated circuit capacitor $C_{B1d}$ and second conductive layers 304d constitute a second capacitor plate of integrated circuit capacitor $C_{B1d}$.

First conductive layers 302a-302d, second conductive layers 304a-304d, first conductive bond layers $302a_B$-$302d_B$, and second conductive bond layers $304a_B$-$304d_B$ each may include any suitable conductive material deposited by any suitable method (e.g., CVD, PVD, etc.). In an embodiment, each first conductive layer 302a-302d is about 20 nm of tungsten, each second conductive layer 304a-304d is about 20 nm of tungsten, each first conductive bond layer $302a_B$-$302d_B$ is about 20 nm of aluminum, and each second conductive bond layer $304a_B$-$304d_B$ is about 20 nm of aluminum. Other conductive layer materials and/or thicknesses may be used.

Capacitor dielectric layers 306a-306d are a high-K dielectric material, such as $SiN_x$, $Ta_2O_5$, $Al_2O_3$, $ZrO_2$, $HfO_2$, or other similar dielectric material. In an embodiment, each capacitor dielectric layer 306a-306d may be about 10 nm of $SiN_x$. Other dielectric materials and/or thicknesses may be used. The higher the dielectric constant used and/or the thinner the dielectric material, the higher the capacitance. Hence the dielectric material property and thickness are the two design parameters to be considered for the design need. These parameters also can vary from layer to layer in this multi-layer structure providing further design flexibility.

First conductive vias 314a extend through the first stack of first conductive layers 302a and second conductive layers 304a and capacitor dielectric layers 306a, and connect to first conductive layers 302a and first conductive bond layers $302a_B$. In this regard, first conductive bond layers $302a_B$ are coupled to the first capacitor plate of integrated circuit capacitor $C_{B1a}$. Second conductive vias 316a extend through the first stack of first conductive layers 302a and second conductive layers 304a and capacitor dielectric layers 306a, and connect to second conductive layers 304a and second conductive bond layers $304a_B$. In this regard, second conductive bond layers $304a_B$ are coupled to the second capacitor plate of integrated circuit capacitor $C_{B1a}$. First conductive vias 314a may be the same material as first conductive layers 302a, or may be a different conductive material. Second conductive vias 316a may be the same material as second conductive layers 304a, or may be a different conductive material.

Openings 320a in dielectric material layer 310 expose portions of first conductive bond layers $302a_B$ and second conductive bond layers $304a_B$, with the exposed portions forming first bond pads $302a_{BP}$ and second bond pads $304a_{BP}$, respectively. In an embodiment, openings 320a have a rectangular shape, although other shapes may be used.

First conductive vias 314b extend through the second stack of first conductive layers 302b and second conductive layers 304b and capacitor dielectric layers 306b, and connect to first conductive layers 302b and first conductive bond layers $302b_B$. In this regard, first conductive bond layers $302b_B$ are coupled to the first capacitor plate of integrated circuit capacitor $C_{B1b}$. Second conductive vias 316b extend through the second stack of first conductive layers 302b and second conductive layers 304b and capacitor dielectric layers 306b, and connect to second conductive layers 304b and second conductive bond layers $304b_B$. In this regard, second conductive bond layers $304b_B$ are coupled to the second capacitor plate of integrated circuit capacitor $C_{B1b}$. First conductive vias 314b may be the same material as first conductive layers 302b, or may be a different conductive material. Second conductive vias 316b may be the same material as second conductive layers 304b, or may be a different conductive material.

Openings 320b in dielectric material layer 310 expose portions of first conductive bond layers $302b_B$ and second conductive bond layers $304b_B$, with the exposed portions forming first bond pads $302b_{BP}$ and second bond pads $304b_{BP}$, respectively. In an embodiment, openings 320b have a rectangular shape, although other shapes may be used.

First conductive vias 314c extend through the third stack of first conductive layers 302c and second conductive layers 304c and capacitor dielectric layers 306c, and connect to first conductive layers 302c and first conductive bond layers $302c_B$. In this regard, first conductive bond layers $302c_B$ are coupled to the first capacitor plate of integrated circuit capacitor $C_{B1c}$. Second conductive vias 316c extend through the third stack of first conductive layers 302c and second conductive layers 304c and capacitor dielectric layers 306c, and connect to second conductive layers 304c and second conductive bond layers $304c_B$. In this regard, second conductive bond layers $304c_B$ are coupled to the second capacitor plate of integrated circuit capacitor $C_{B1c}$. First conductive vias 314c may be the same material as first conductive layers 302c, or may be a different conductive material. Second conductive vias 316c may be the same material as second conductive layers 304c, or may be a different conductive material.

Openings 320c in dielectric material layer 310 expose portions of first conductive bond layers $302c_B$ and second conductive bond layers $304c_B$, with the exposed portions forming first bond pads $302c_{BP}$ and second bond pads $304c_{BP}$, respectively. In an embodiment, openings 320c have a rectangular shape, although other shapes may be used.

First conductive vias 314d extend through the fourth stack of first conductive layers 302d and second conductive layers 304d and capacitor dielectric layers 306d, and connect to first conductive layers 302d and first conductive bond layers $302d_B$. In this regard, first conductive bond layers $302d_B$ are coupled to the first capacitor plate of integrated circuit capacitor $C_{B1d}$. Second conductive vias 316d extend through the fourth stack of first conductive layers 302d and second conductive layers 304d and capacitor dielectric layers 306d, and connect to second conductive layers 304d and second conductive bond layers $304d_B$. In this regard, second conductive bond layers $304d_B$ are coupled to the second capacitor plate of integrated circuit capacitor $C_{B1d}$. First conductive vias 314d may be the same material as first conductive layers 302d, or may be a different conductive material. Second conductive vias 316d may be the same material as second conductive layers 304d, or may be a different conductive material.

Openings 320d in dielectric material layer 310 expose portions of first conductive bond layers $302d_B$ and second conductive bond layers $304d_B$, with the exposed portions forming first bond pads $302d_{BP}$ and second bond pads $304d_{BP}$, respectively. In an embodiment, openings 320b have a rectangular shape, although other shapes may be used.

Figure 4A:
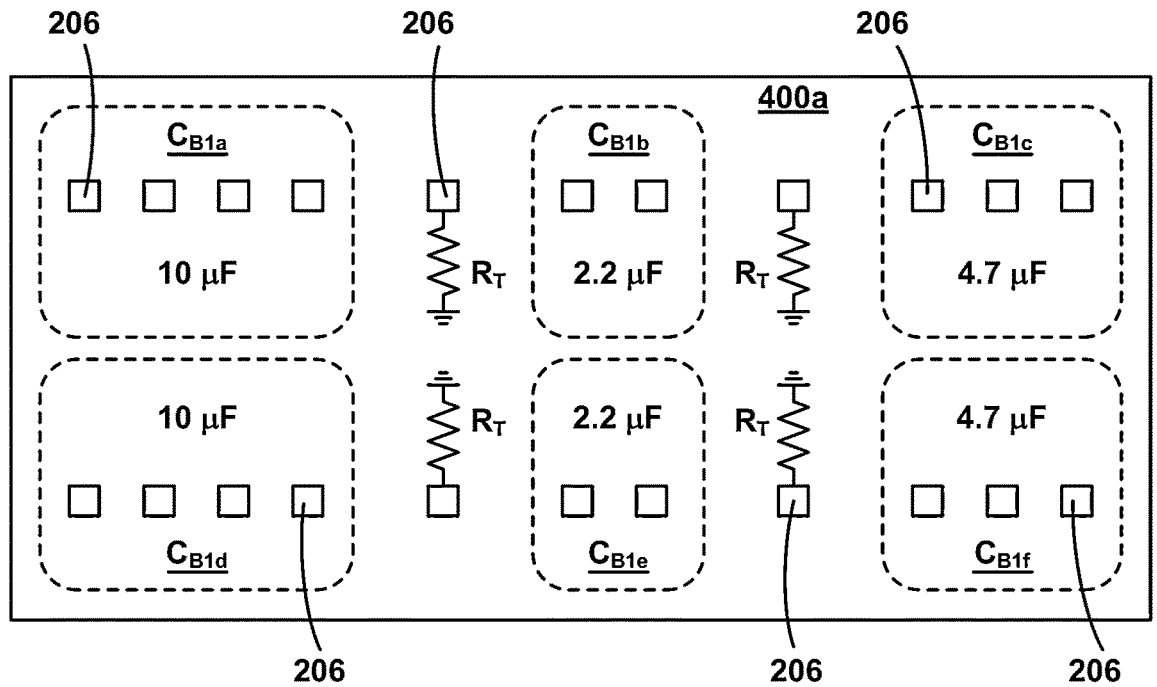
FIGS. 4A-4B depict simplified schematic diagrams of embodiments of capacitor die of the described technology.

FIG. 4A is a simplified diagram of a top view of a Cap Die 400a, which is an example implementation of Cap Die 204 of FIG. 2A. Cap Die 400a includes six integrated circuit capacitors $C_{B1a}$, $C_{B1b}$, ..., $C_{B1f}$, although more or fewer than six integrated circuit capacitors may be used. Each of integrated circuit capacitors $C_{B1a}$, $C_{B1b}$, ..., $C_{B1f}$ includes two or more bond pads 206 that are coupled to first and second capacitor plates of the corresponding integrated circuit capacitor.

In this example embodiment, Cap Die 400*a* includes pre-configured capacitor values. For example, integrated circuit capacitors $C_{B1a}$ and $C_{B1b}$ are 10 µF capacitors, integrated circuit capacitors $C_{B1b}$ and $C_{B1c}$ are 2.2 µF capacitors, and integrated circuit capacitors $C_{B1c}$ and $C_{B1f}$ are 4.7 µF capacitors. Other capacitor values may be used. In addition, Cap Die 400*a* optionally may include on-die termination resistors $R_T$, which may be used for terminating signals (e.g., high speed, high performance signals such as input/output signals) in semiconductor device 200 of FIG. 2A.

Figure 4B:
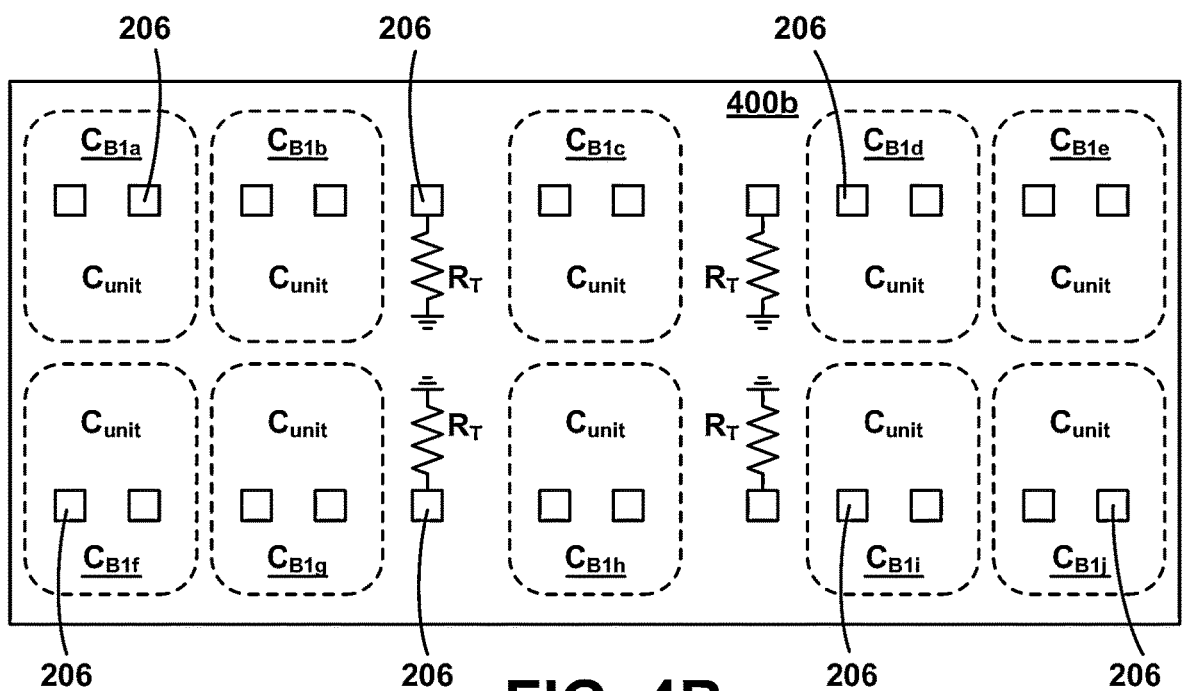

FIG. 4B is a simplified diagram of a top view of a Cap Die 400*b*, which is an example implementation of Cap Die 204 of FIG. 2A. Cap Die 400*b* includes ten integrated circuit capacitors $C_{B1a}$, $C_{B1b}$, ..., $C_{B1j}$, although more or fewer than ten integrated circuit capacitors may be used. Each of integrated circuit capacitors $C_{B1a}$, $C_{B1b}$, ..., $C_{B1j}$ includes two (or more) bond pads 206 that are coupled to first and second capacitor plates of the corresponding integrated circuit capacitor.

In this example embodiment, Cap Die 400*b* includes repeatable unit capacitor values that may be combined as needed to achieve a desired capacitor value. For example, each of integrated circuit capacitors $C_{B1a}$, $C_{B1b}$, ..., $C_{B1j}$ may be 1 µF capacitors that may be selectively coupled to achieve a desired capacitor value. Other capacitor values may be used. In other embodiments, Cap Die 400*b* may include a combination of pre-configured capacitor values and unit capacitor values. In addition, Cap Die 400*b* also optionally may include on-die termination resistors $R_T$, which may be used for terminating signals in semiconductor device 200 of FIG. 2A.

One embodiment includes an apparatus that includes a die stack having a first die and a second die disposed above a substrate, and a capacitor die disposed in the die stack between the first die and the second die. The capacitor die includes a plurality of integrated circuit capacitors that are configured to be selectively coupled together to form a desired capacitor value coupled to at least one of the first die and the second die.

One embodiment includes an apparatus that includes a die stack including a plurality of die disposed above a substrate, and a capacitor die disposed in the die stack. The capacitor die includes an integrated circuit capacitor, and bond pads that are configured to accommodate multiple wire bonds.

One embodiment includes a method that includes disposing a capacitor die in a die stack above a substrate, the capacitor die including a plurality of integrated circuit capacitors coupled to bond pads that are configured to accommodate multiple wire bonds, the substrate including power supply contact pads, selectively coupling the plurality of integrated circuit capacitors to tune a capacitor value of the capacitor die, and selectively coupling the bond pads to the power supply contact pads via a plurality of wire bonds to tune an inductance of the wire bonds.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

For purposes of this document, the terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In an embodiment, the acceptable manufacturing tolerance is ±0.25%. As used herein the term "semiconductor die" or simply "die" may refer to one or more semiconductor die.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
 a die stack comprising a first die and a second die disposed above a substrate; and
 a capacitor die disposed in the die stack between the first die and the second die, wherein:
  the capacitor die comprises a plurality of integrated circuit capacitors that are configured to be selectively coupled together to form a desired capacitor value coupled to at least one of the first die and the second die;
  the capacitor die further comprises a plurality of switches coupled to the plurality of integrated circuit capacitors; and
  the plurality of switches are selectively configured to form the desired capacitor value.

2. The apparatus of claim 1, wherein the capacitor die further comprises a plurality of bond pads coupled to the integrated circuit capacitors, each bond pad sized to accommodate multiple wire bonds.

3. The apparatus of claim 1, wherein the capacitor die further comprises a first plurality of bond pads coupled to a first capacitor plate of the integrated circuit capacitors, and a second plurality of bond pads coupled to a second capacitor plate of the integrated circuit capacitors.

4. The apparatus of claim 1, wherein the capacitor die further comprises a plurality of bond pads coupled to the integrated circuit capacitors, and wherein the apparatus further comprises a plurality of wire bonds coupled to the bond pads.

5. The apparatus of claim 1, wherein the first die comprises power supply bond pads coupled to the capacitor die.

6. The apparatus of claim 1, wherein the substrate comprises power supply contact pads coupled to the capacitor die.

7. The apparatus of claim 1, wherein the substrate comprises a first power supply contact pad coupled by way of a first plurality of wire bonds to a first bond pad of the capacitor die, and a second power supply contact pad coupled by way of a second plurality of wire bonds to a second bond pad of the capacitor die.

8. The apparatus of claim 1, wherein the capacitor die comprises a power supply bypass capacitor.

9. The apparatus of claim 1, wherein the capacitor die comprises dimensions the same as dimensions of the first die and the second die.

10. The apparatus of claim 1, wherein the capacitor die comprises a first set of first bond pads and a first set of second bond pads disposed adjacent a first side of the capacitor die, and a second set of first bond pads and a second set of second bond pads disposed adjacent a second side of the capacitor die.

11. An apparatus comprising:
a die stack comprising a plurality of die disposed above a substrate; and
a capacitor die disposed in the die stack and comprising a plurality of integrated circuit capacitors each comprising a first capacitor plate coupled to a first bond pad and a second capacitor plate coupled via a corresponding one of a plurality of switches to a second bond pad, wherein the first and second bond pads are configured to accommodate multiple wire bonds.

12. The apparatus of claim 11, wherein the plurality of switches are configured to selectively couple the integrated circuit capacitors to form a desired capacitor value.

13. The apparatus of claim 11, wherein:
the die stack comprises a die comprising power supply bond pads coupled to the capacitor die bond pads with a first plurality of wire bonds; and
the substrate comprises power supply contact pads coupled to the capacitor die bond pads with a second plurality of wire bonds.

14. The apparatus of claim 11, wherein the capacitor die further comprises a resistor configured for terminating signals.

15. A method comprising:
disposing a capacitor die in a die stack above a substrate, the capacitor die comprising a plurality of integrated circuit capacitors coupled to bond pads that are configured to accommodate multiple wire bonds, the substrate comprising power supply contact pads;
selectively coupling the plurality of integrated circuit capacitors to tune a capacitor value of the capacitor die; and
selectively coupling the bond pads to the power supply contact pads via a plurality of wire bonds to tune an inductance of the wire bonds.

16. The method of claim 15, further comprising selectively tuning the capacitor value of the capacitor die and the inductance of the wire bonds to reduce power supply noise at a die in the die stack.

17. The method of claim 15, further comprising selectively tuning the capacitor value of the capacitor die and the inductance of the wire bonds to create a low impedance profile in a target frequency range of a power delivery network comprising the power supply contact pads.

18. The method of claim 15, further comprising electrically coupling the bond pads of the capacitor die to power supply bond pads of a die in the die stack.

* * * * *